US009601267B2

(12) United States Patent
Widmer et al.

(10) Patent No.: US 9,601,267 B2
(45) Date of Patent: Mar. 21, 2017

(54) WIRELESS POWER TRANSMITTER WITH A PLURALITY OF MAGNETIC OSCILLATORS

(71) Applicant: QUALCOMM Incorporated, San Diego, CA (US)

(72) Inventors: Hanspeter Widmer, Wohlenschwil (CH); Nigel P. Cook, El Cajon, CA (US); Markus Bittner, Sarmenstorf (CH)

(73) Assignee: QUALCOMM Incorporated, San Diego, CA (US)

( * ) Notice: Subject to any disclaimer, the term of this patent is extended or adjusted under 35 U.S.C. 154(b) by 716 days.

(21) Appl. No.: 14/077,102

(22) Filed: Nov. 11, 2013

(65) Prior Publication Data

US 2015/0008751 A1    Jan. 8, 2015

Related U.S. Application Data

(60) Provisional application No. 61/842,656, filed on Jul. 3, 2013.

(51) Int. Cl.
*H01F 38/14*    (2006.01)
*H02J 7/02*    (2016.01)
(Continued)

(52) U.S. Cl.
CPC .............. *H01F 38/14* (2013.01); *H02J 7/025* (2013.01); *H02J 17/00* (2013.01); *H04B 5/0037* (2013.01)

(58) Field of Classification Search
CPC ...................................................... H02J 50/00
See application file for complete search history.

(56) References Cited

U.S. PATENT DOCUMENTS 3,098,971 A    7/1963    Richardson
3,480,229 A    11/1969    Entremont
(Continued)

FOREIGN PATENT DOCUMENTS

CN    1202025 A    12/1998
CN    1231069 A    10/1999
(Continued)

OTHER PUBLICATIONS

Bayrashev, Andrey, et al., "Low frequency wireless powering of microsystems using piezoelectric-magnetostrictive laminate composites," Sensors & Actuators A: Physical, Sep. 2004, vol. 114, Issue 2/3, pp. 244-249.

(Continued)

*Primary Examiner* — Daniel Cavallari
(74) *Attorney, Agent, or Firm* — Knobbe Martens Olson & Bear LLP

(57) ABSTRACT

A power transmitter is configured to wirelessly transfer power to at least one power receiver. The power transmitter includes at least one excitation circuit configured to generate a time-varying first magnetic field in response to a time-varying electric current flowing through the at least one excitation circuit. The time-varying first magnetic field has an excitation frequency. The power transmitter further includes a plurality of magnetic oscillators. Each magnetic oscillator of the plurality of magnetic oscillators has a mechanical resonant frequency substantially equal to the excitation frequency. The plurality of magnetic oscillators is configured to generate a time-varying second magnetic field in response to the first magnetic field.

21 Claims, 13 Drawing Sheets

Induction Coil

(51) Int. Cl.
*H02J 17/00* (2006.01)
*H04B 5/00* (2006.01)

(56) References Cited

U.S. PATENT DOCUMENTS

| | | |
|---|---|---|
| 3,588,905 A | 6/1971 | Dunlavy, Jr. |
| 3,675,108 A | 7/1972 | Nicholl |
| 3,918,062 A | 11/1975 | Haruki et al. |
| 3,938,018 A | 2/1976 | Dahl |
| 3,999,185 A | 12/1976 | Polgar, Jr. et al. |
| 4,088,999 A | 5/1978 | Fletcher et al. |
| 4,388,524 A | 6/1983 | Walton |
| 4,390,924 A | 6/1983 | Nebiker, Jr. |
| 4,473,825 A | 9/1984 | Walton |
| 4,524,411 A | 6/1985 | Willis |
| 4,760,394 A | 7/1988 | Takeuchi et al. |
| 4,914,539 A | 4/1990 | Turner et al. |
| 4,959,568 A | 9/1990 | Stokes |
| 4,959,764 A | 9/1990 | Bassett |
| 5,027,709 A | 7/1991 | Slagle |
| 5,072,233 A | 12/1991 | Zanzig |
| 5,153,583 A | 10/1992 | Murdoch |
| 5,175,561 A | 12/1992 | Goto |
| 5,387,818 A | 2/1995 | Leibowitz |
| 5,396,538 A | 3/1995 | Hong |
| 5,397,962 A | 3/1995 | Moslehi |
| 5,438,699 A | 8/1995 | Coveley |
| 5,450,305 A | 9/1995 | Boys et al. |
| 5,455,466 A | 10/1995 | Parks et al. |
| 5,491,715 A | 2/1996 | Flaxl |
| 5,519,262 A | 5/1996 | Wood |
| 5,596,567 A | 1/1997 | DeMuro et al. |
| 5,608,417 A | 3/1997 | De Vall |
| 5,621,322 A | 4/1997 | Ehnholm |
| 5,654,621 A | 8/1997 | Seelig |
| 5,684,828 A | 11/1997 | Bolan et al. |
| 5,734,255 A | 3/1998 | Thompson et al. |
| 5,767,601 A | 6/1998 | Uchiyama |
| 5,796,240 A | 8/1998 | Saito et al. |
| 5,821,638 A | 10/1998 | Boys et al. |
| 5,856,710 A | 1/1999 | Baughman et al. |
| 5,874,797 A | 2/1999 | Pinkerton |
| 5,936,575 A | 8/1999 | Azzarelli et al. |
| 5,963,012 A | 10/1999 | Garcia et al. |
| 5,966,941 A | 10/1999 | Ghoshal |
| 5,975,714 A | 11/1999 | Vetorino et al. |
| 5,982,139 A | 11/1999 | Parise |
| 6,016,046 A | 1/2000 | Kaite et al. |
| 6,028,413 A | 2/2000 | Brockmann |
| 6,031,708 A | 2/2000 | Guermeur |
| 6,040,680 A | 3/2000 | Toya et al. |
| 6,040,986 A | 3/2000 | Sakamoto et al. |
| 6,104,354 A | 8/2000 | Hill et al. |
| 6,114,834 A | 9/2000 | Parise |
| 6,127,799 A | 10/2000 | Krishnan |
| 6,175,124 B1 | 1/2001 | Cole et al. |
| 6,184,651 B1 | 2/2001 | Fernandez et al. |
| 6,265,789 B1 | 7/2001 | Honda et al. |
| 6,275,681 B1 | 8/2001 | Vega et al. |
| 6,291,901 B1 | 9/2001 | Cefo |
| 6,317,338 B1 | 11/2001 | Boys |
| 6,337,628 B2 | 1/2002 | Campana, Jr. |
| 6,341,076 B1 | 1/2002 | Kadatskyy et al. |
| 6,411,824 B1 | 6/2002 | Eidson |
| 6,437,685 B2 | 8/2002 | Hanaki |
| 6,507,152 B2 | 1/2003 | Matsumoto et al. |
| 6,523,493 B1 | 2/2003 | Brcka |
| 6,556,054 B1 | 4/2003 | Goodman et al. |
| 6,633,026 B2 | 10/2003 | Tuominen |
| 6,636,146 B1 | 10/2003 | Wehoski |
| 6,670,864 B2 | 12/2003 | Hyvonen et al. |
| 6,798,716 B1 | 9/2004 | Charych |
| 6,803,744 B1 | 10/2004 | Sabo |
| 6,879,076 B2 | 4/2005 | Long |
| 6,891,287 B2 | 5/2005 | Moret |
| 6,912,137 B2 | 6/2005 | Berghegger |
| 6,960,968 B2 | 11/2005 | Odendaal et al. |
| 6,965,352 B2 | 11/2005 | Ohara et al. |
| 6,967,462 B1 | 11/2005 | Landis |
| 6,972,542 B2 | 12/2005 | Patino et al. |
| 6,972,543 B1 | 12/2005 | Wells |
| 7,012,405 B2 | 3/2006 | Nishida et al. |
| 7,068,991 B2 | 6/2006 | Parise |
| 7,076,206 B2 | 7/2006 | Elferich et al. |
| 7,095,301 B2 | 8/2006 | Hidaka et al. |
| 7,110,462 B2 | 9/2006 | Monsen |
| 7,116,018 B2 | 10/2006 | Strobl |
| 7,142,811 B2 | 11/2006 | Terranova et al. |
| 7,154,451 B1 | 12/2006 | Sievenpiper |
| 7,164,344 B2 | 1/2007 | Deguchi et al. |
| 7,167,139 B2 | 1/2007 | Kim et al. |
| 7,180,265 B2 | 2/2007 | Naskali et al. |
| 7,180,291 B2 | 2/2007 | Chmielewski et al. |
| 7,209,792 B1 | 4/2007 | Parramon et al. |
| 7,212,414 B2 | 5/2007 | Baarman |
| 7,215,061 B2 | 5/2007 | Kihara et al. |
| 7,248,165 B2 | 7/2007 | Collins et al. |
| 7,256,532 B2 | 8/2007 | Viehland et al. |
| 7,262,701 B1 | 8/2007 | Nguyen |
| 7,380,150 B2 | 5/2008 | Meier et al. |
| 7,423,518 B2 | 9/2008 | Yamada |
| 7,511,500 B2 | 3/2009 | Schiano et al. |
| 7,525,283 B2 | 4/2009 | Cheng et al. |
| 7,554,316 B2 | 6/2009 | Stevens et al. |
| 7,598,646 B2 | 10/2009 | Cleveland |
| 7,675,197 B2 | 3/2010 | Tetlow |
| 7,676,263 B2 | 3/2010 | Harris et al. |
| 7,684,868 B2 | 3/2010 | Tai et al. |
| 7,741,734 B2 | 6/2010 | Joannopoulos et al. |
| 7,755,552 B2 | 7/2010 | Schantz et al. |
| 7,760,151 B2 | 7/2010 | Poilasne et al. |
| 7,777,396 B2 | 8/2010 | Rastegar et al. |
| 7,825,543 B2 | 11/2010 | Karalis et al. |
| 7,839,124 B2 | 11/2010 | Yamazaki et al. |
| 7,844,306 B2 | 11/2010 | Shearer et al. |
| 7,868,482 B2 | 1/2011 | Greene et al. |
| 7,885,050 B2 | 2/2011 | Lee |
| 8,055,310 B2 | 11/2011 | Beart et al. |
| 8,093,869 B1 | 1/2012 | Gunderson |
| 8,159,412 B2 | 4/2012 | Yun et al. |
| 8,169,185 B2 | 5/2012 | Partovi et al. |
| 2001/0012208 A1 | 8/2001 | Boys |
| 2001/0026244 A1 | 10/2001 | Ieda et al. |
| 2001/0029167 A1 | 10/2001 | Takeda et al. |
| 2002/0017979 A1 | 2/2002 | Krause et al. |
| 2002/0036977 A1 | 3/2002 | Lenssen et al. |
| 2002/0057161 A1 | 5/2002 | Katsura et al. |
| 2002/0057584 A1 | 5/2002 | Brockmann |
| 2002/0190908 A1 | 12/2002 | Andrews et al. |
| 2003/0090353 A1 | 5/2003 | Robinson et al. |
| 2003/0162566 A1 | 8/2003 | Shapira et al. |
| 2003/0174099 A1 | 9/2003 | Bauer et al. |
| 2003/0193438 A1 | 10/2003 | Yoon |
| 2003/0199778 A1 | 10/2003 | Mickle et al. |
| 2003/0203733 A1 | 10/2003 | Sharon |
| 2003/0214961 A1 | 11/2003 | Nevo et al. |
| 2004/0001029 A1 | 1/2004 | Parsche et al. |
| 2004/0130425 A1 | 7/2004 | Dayan et al. |
| 2004/0150521 A1 | 8/2004 | Stilp |
| 2004/0160323 A1 | 8/2004 | Stilp |
| 2004/0204781 A1 | 10/2004 | Hsien |
| 2004/0212500 A1 | 10/2004 | Stilp |
| 2004/0227002 A1 | 11/2004 | Watanabe |
| 2004/0227057 A1 | 11/2004 | Tuominen et al. |
| 2004/0227619 A1 | 11/2004 | Watanabe |
| 2005/0007239 A1 | 1/2005 | Woodard et al. |
| 2005/0017677 A1 | 1/2005 | Burton et al. |
| 2005/0029351 A1 | 2/2005 | Yoshinaga et al. |
| 2005/0043055 A1 | 2/2005 | Vance |
| 2005/0057422 A1 | 3/2005 | Deguchi et al. |
| 2005/0075697 A1 | 4/2005 | Olson et al. |
| 2005/0104457 A1 | 5/2005 | Jordan et al. |
| 2005/0125093 A1 | 6/2005 | Kikuchi et al. |
| 2005/0127867 A1 | 6/2005 | Calhoon et al. |

(56) References Cited

U.S. PATENT DOCUMENTS

| | | |
|---|---|---|
| 2005/0131495 A1 | 6/2005 | Parramon et al. |
| 2005/0194926 A1 | 9/2005 | Di Stefano |
| 2005/0273143 A1 | 12/2005 | Kanzius et al. |
| 2006/0017438 A1 | 1/2006 | Mullen et al. |
| 2006/0061325 A1 | 3/2006 | Tang et al. |
| 2006/0071790 A1 | 4/2006 | Duron et al. |
| 2006/0094449 A1 | 5/2006 | Goldberg |
| 2006/0103355 A1 | 5/2006 | Patino et al. |
| 2006/0113955 A1 | 6/2006 | Nunally |
| 2006/0125703 A1 | 6/2006 | Ma et al. |
| 2006/0145659 A1 | 7/2006 | Patino et al. |
| 2006/0145660 A1 | 7/2006 | Black et al. |
| 2006/0159536 A1 | 7/2006 | Pu |
| 2006/0160517 A1 | 7/2006 | Yoon |
| 2006/0164312 A1 | 7/2006 | Mathieu |
| 2006/0208903 A1 | 9/2006 | Loh et al. |
| 2006/0239043 A1 | 10/2006 | Ohbo |
| 2006/0273756 A1 | 12/2006 | Bowling et al. |
| 2007/0010295 A1 | 1/2007 | Greene et al. |
| 2007/0029965 A1 | 2/2007 | Hui et al. |
| 2007/0046433 A1 | 3/2007 | Mukherjee |
| 2007/0054705 A1 | 3/2007 | Liow et al. |
| 2007/0060221 A1 | 3/2007 | Burgan et al. |
| 2007/0082611 A1 | 4/2007 | Terranova et al. |
| 2007/0091006 A1 | 4/2007 | Thober et al. |
| 2007/0096910 A1 | 5/2007 | Waters |
| 2007/0103110 A1 | 5/2007 | Sagoo |
| 2007/0103291 A1 | 5/2007 | Adams |
| 2007/0105524 A1 | 5/2007 | Fullam et al. |
| 2007/0114945 A1 | 5/2007 | Mattaboni et al. |
| 2007/0120678 A1 | 5/2007 | Posamentier |
| 2007/0126395 A1 | 6/2007 | Suchar |
| 2007/0126650 A1 | 6/2007 | Guenther |
| 2007/0135078 A1 | 6/2007 | Ljung |
| 2007/0139000 A1 | 6/2007 | Kozuma et al. |
| 2007/0145830 A1 | 6/2007 | Lee et al. |
| 2007/0146218 A1 | 6/2007 | Turner et al. |
| 2007/0156204 A1 | 7/2007 | Denker et al. |
| 2007/0164414 A1 | 7/2007 | Dokai et al. |
| 2007/0171681 A1 | 7/2007 | Baarman |
| 2007/0178945 A1 | 8/2007 | Cook et al. |
| 2007/0188326 A1 | 8/2007 | Pluss et al. |
| 2007/0205881 A1 | 9/2007 | Breed |
| 2007/0214940 A1 | 9/2007 | Stoneback |
| 2007/0281625 A1 | 12/2007 | Boys |
| 2007/0296393 A1 | 12/2007 | Malpas et al. |
| 2007/0296548 A1 | 12/2007 | Hall et al. |
| 2007/0298846 A1 | 12/2007 | Greene et al. |
| 2008/0003963 A1 | 1/2008 | Turner |
| 2008/0014897 A1 | 1/2008 | Cook et al. |
| 2008/0054638 A1 | 3/2008 | Greene et al. |
| 2008/0067874 A1 | 3/2008 | Tseng |
| 2008/0074083 A1 | 3/2008 | Yarger et al. |
| 2008/0093934 A1 | 4/2008 | Kato |
| 2008/0108862 A1 | 5/2008 | Jordan et al. |
| 2008/0122294 A1 | 5/2008 | Simon et al. |
| 2008/0122297 A1 | 5/2008 | Arai |
| 2008/0129147 A1 | 6/2008 | Thiesen et al. |
| 2008/0167755 A1 | 7/2008 | Curt |
| 2008/0186129 A1 | 8/2008 | Fitzgibbon |
| 2008/0191897 A1 | 8/2008 | McCollough |
| 2008/0211320 A1 | 9/2008 | Cook et al. |
| 2008/0211455 A1 | 9/2008 | Park et al. |
| 2008/0225564 A1 | 9/2008 | Bohm et al. |
| 2008/0293446 A1 | 11/2008 | Rofougaran |
| 2008/0296978 A1 | 12/2008 | Finkenzeller et al. |
| 2008/0309452 A1 | 12/2008 | Zeine |
| 2009/0002175 A1 | 1/2009 | Waters |
| 2009/0009177 A1 | 1/2009 | Kim et al. |
| 2009/0026907 A1 | 1/2009 | Davidowitz et al. |
| 2009/0045772 A1 | 2/2009 | Cook et al. |
| 2009/0051224 A1 | 2/2009 | Cook et al. |
| 2009/0052721 A1 | 2/2009 | Dabrowski |
| 2009/0058361 A1 | 3/2009 | John |
| 2009/0072627 A1 | 3/2009 | Cook et al. |
| 2009/0079268 A1 | 3/2009 | Cook et al. |
| 2009/0102296 A1 | 4/2009 | Greene et al. |
| 2009/0102419 A1 | 4/2009 | Gwon et al. |
| 2009/0109102 A1 | 4/2009 | Dokai et al. |
| 2009/0111531 A1 | 4/2009 | Cui et al. |
| 2009/0121713 A1 | 5/2009 | Van Helvoort |
| 2009/0127937 A1 | 5/2009 | Widmer et al. |
| 2009/0146892 A1 | 6/2009 | Shimizu et al. |
| 2009/0167449 A1* | 7/2009 | Cook ............... H02J 5/005 331/154 |
| 2009/0204170 A1 | 8/2009 | Hastings et al. |
| 2009/0218884 A1 | 9/2009 | Soar |
| 2009/0243394 A1 | 10/2009 | Levine |
| 2009/0273242 A1 | 11/2009 | Cook |
| 2009/0299918 A1 | 12/2009 | Cook et al. |
| 2009/0308933 A1 | 12/2009 | Osada |
| 2010/0013434 A1 | 1/2010 | Taylor-Haw et al. |
| 2010/0068998 A1 | 3/2010 | Zyambo et al. |
| 2010/0109445 A1 | 5/2010 | Kurs et al. |
| 2010/0134366 A1 | 6/2010 | Yu |
| 2010/0176936 A1 | 7/2010 | Garber et al. |
| 2010/0277387 A1 | 11/2010 | Schantz et al. |
| 2010/0289331 A1 | 11/2010 | Shionoiri et al. |
| 2010/0289449 A1 | 11/2010 | Elo |
| 2010/0315045 A1 | 12/2010 | Zeine |
| 2011/0031821 A1 | 2/2011 | Greene et al. |
| 2011/0050166 A1 | 3/2011 | Cook et al. |
| 2011/0069516 A1 | 3/2011 | Greene et al. |
| 2011/0074349 A1 | 3/2011 | Ghovanloo |
| 2011/0304220 A1 | 12/2011 | Whitehead |
| 2013/0175876 A1* | 7/2013 | Kiyota ............... H02J 5/005 307/104 |

FOREIGN PATENT DOCUMENTS

| | | | |
|---|---|---|---|
| CN | 2582188 Y | 10/2003 | |
| DE | 4023412 | 2/1992 | |
| DE | 19509918 | 9/1996 | |
| DE | 19729722 | 1/1999 | |
| DE | 19938460 | 2/2001 | |
| DE | 102004009896 | 9/2005 | |
| DE | 102005053111 | 5/2007 | |
| EP | 0568920 | 11/1993 | |
| EP | 0298707 | 9/1994 | |
| EP | 0724308 | 7/1996 | |
| EP | 0773509 | 4/2002 | |
| EP | 1233547 A1 | 8/2002 | |
| EP | 1302822 | 4/2003 | |
| EP | 1315051 | 5/2003 | |
| EP | 1003266 | 4/2006 | |
| EP | 1413975 | 5/2007 | |
| EP | 1892799 | 2/2008 | |
| FI | WO 2012152980 A1 * | 11/2012 | ............... H01F 3/10 |
| GB | 1280516 | 7/1972 | |
| GB | 1343071 | 1/1974 | |
| GB | 2070298 | 9/1981 | |
| GB | 2318696 | 4/1998 | |
| JP | 57032144 | 2/1982 | |
| JP | 62071430 A | 4/1987 | |
| JP | 1298901 A | 12/1989 | |
| JP | 4115606 A | 4/1992 | |
| JP | 04271201 | 9/1992 | |
| JP | 5038232 A | 2/1993 | |
| JP | 05183318 | 7/1993 | |
| JP | 06133476 | 5/1994 | |
| JP | 6044207 U | 6/1994 | |
| JP | 6303726 | 10/1994 | |
| JP | 6327172 A | 11/1994 | |
| JP | 6339232 | 12/1994 | |
| JP | 8033244 A | 2/1996 | |
| JP | 8079976 | 3/1996 | |
| JP | 8088942 | 4/1996 | |
| JP | 8130840 A | 5/1996 | |
| JP | 8162689 A | 6/1996 | |
| JP | 9037475 | 2/1997 | |
| JP | 9182322 | 7/1997 | |
| JP | 10097931 | 4/1998 | |
| JP | 10225020 | 8/1998 | |
| JP | 11143600 | 5/1999 | |

(56) References Cited

FOREIGN PATENT DOCUMENTS

| JP | 11188113 | A | 7/1999 |
|---|---|---|---|
| JP | 11191146 | | 7/1999 |
| JP | 11215802 | A | 8/1999 |
| JP | 11332135 | | 11/1999 |
| JP | 2000078763 | | 3/2000 |
| JP | 2000175379 | | 6/2000 |
| JP | 2000217279 | | 8/2000 |
| JP | 2001024548 | A | 1/2001 |
| JP | 2001197672 | | 7/2001 |
| JP | 2001238372 | A | 8/2001 |
| JP | 2001264432 | A | 9/2001 |
| JP | 2001526374 | A | 12/2001 |
| JP | 2002017058 | A | 1/2002 |
| JP | 2002078247 | A | 3/2002 |
| JP | 2002508916 | A | 3/2002 |
| JP | 2002152191 | A | 5/2002 |
| JP | 2002320347 | | 10/2002 |
| JP | 2003047177 | A | 2/2003 |
| JP | 2003069335 | A | 3/2003 |
| JP | 2003189507 | A | 7/2003 |
| JP | 2004187429 | A | 7/2004 |
| JP | 2005039756 | A | 2/2005 |
| JP | 2005045298 | A | 2/2005 |
| JP | 2005137040 | | 5/2005 |
| JP | 2005261187 | A | 9/2005 |
| JP | 2006042519 | | 2/2006 |
| JP | 2006510101 | A | 3/2006 |
| JP | 2006115592 | A | 4/2006 |
| JP | 2006149163 | A | 6/2006 |
| JP | 2008508842 | A | 3/2008 |
| JP | 2009501510 | A | 1/2009 |
| JP | 2010539821 | A | 12/2010 |
| KR | 102000017058 | | 3/2000 |
| KR | 1020010000674 | | 1/2001 |
| KR | 1020010030472 | | 4/2001 |
| KR | 20020064451 | A | 8/2002 |
| KR | 20050016879 | A | 2/2005 |
| KR | 1020050019926 | | 3/2005 |
| KR | 20060070795 | A | 6/2006 |
| KR | 20070017804 | A | 2/2007 |
| WO | WO-8807732 | | 10/1988 |
| WO | WO-9323908 | A1 | 11/1993 |
| WO | WO-9619028 | | 6/1996 |
| WO | WO-9850993 | A1 | 11/1998 |
| WO | WO-9857413 | A1 | 12/1998 |
| WO | WO-9930090 | A1 | 6/1999 |
| WO | WO-9950780 | | 10/1999 |
| WO | WO-9950806 | | 10/1999 |
| WO | WO-0167413 | | 9/2001 |
| WO | WO-02060215 | | 8/2002 |
| WO | WO-03077364 | A2 | 9/2003 |
| WO | WO-2004038887 | | 5/2004 |
| WO | WO-2004052563 | | 6/2004 |
| WO | WO-2004077550 | | 9/2004 |
| WO | WO-2005086279 | | 9/2005 |
| WO | WO-2006006636 | A1 | 1/2006 |
| WO | WO-2006011769 | A1 | 2/2006 |
| WO | WO-2006031785 | | 3/2006 |
| WO | WO-2007008646 | A2 | 1/2007 |
| WO | WO-2007048052 | | 4/2007 |
| WO | WO-2007077442 | | 7/2007 |
| WO | WO-2007083574 | A1 | 7/2007 |
| WO | WO-2009049281 | A2 | 4/2009 |
| WO | WO-2009065099 | A2 | 5/2009 |

OTHER PUBLICATIONS

Chunbo, et al.,"Research on the topology of wireless energy transfer device", Sch. of Electr. Eng. & Autom., Harbin Inst. of Technol., Harbin This paper appears in: Vehicle Power and Propulsion Conference, 2008. VPPC '08. IEEE Issue Date : Sep. 3-5, 2008 On p. 1 Print ISBN: 978-1-4244-1848-0 Inspec Accession No. 10394615 Digital Object Identifier: 10.1109/VPPC.2008.4677798 Date of Current Version : Nov. 18, 2008.

Dong-Gi Youn, et al, "A Study on the Fundamental Transmission Experiment for Wireless Power Transmission System," 1999 IEEE Conference, TENCON 99, vol. 2, pp. 1419-1422, Sep. 1999.

Dudek, et al., "High permeability micro-magneto-mechanical systems," International Journal of Applied Electromagnetics and Mechanics (2007), vol. 25, pp. 103-108.

Finkenzeller, "RFID Handbook: Fundamentals and Applications in Contactless Smart Cards and Identification," Second Edition, Translated by Rachel Waddington, 2003, John Wiley & Sons Ltd., pp. 106-111.

Harrist, Wireless battery charging system using radio frequency energy harvesting, Master of Science Thesis, University of Pittsburgh, 2004; 70 pages.

McSpadden, et al, "A High Conversion Efficiency 5.8 GHz Rectenna," 1997 IEEE Microwave Symposium, vol. 2, pp. 547-550, Jun. 1997.

McSpadden, et al, "Theoretical and Experimental Investigation of a Rectenna Element for Microwave Power Transmission," 1992 IEEE Transactions on Microwave Theory and Techniques, vol. 40, pp. 2359-2366, Dec. 1992.

Karalis et al., "Efficient wireless non-radiative mid-range energy transfer", MIT paper, publication and date unknown, believed to be 2007.

Karalis et al., "Efficient wireless non-radiative mid-range energy transfer", Science Direct, Annals of Physics, 323(1),34-48, Apr. 17, 2007. doi:10.1016/j.aop.2007.04.27.

Karalis et al., "Wireless Non-Radiative Energy Transfer", MIT paper, publication and date unknown, believed to be 2007.

Kim et al., "Electrically Small Magnetic Dipole Antennas With Quality Factors Approaching the Chu Lower Bound", Antennas and Propagation, IEEE Transactions on vol. 58 Issue: 6 Publication Date: Jun. 2010 pp. 1898-1906 Digital Object Identifier: 10.1109/TAP.2010.2046864.

Kim, et al., Switchable polymer-based thin film coils as a power module wireless neural interfaces, Sensors and Actuators, vol. A 136, Issue 1, May 2007 (available online Nov. 27, 2006), pp. 467-474.

Kurs et al., "Wireless Power Transfer via Strongly Coupled Magnetic Resonances", Science Express, Jun. 7, 2007, pp. 83-86, vol. 317 No. 5834, DOI: 10.1126/science.1143254.

Kurs et al., "Wireless Power Transfer via Strongly Coupled Magnetic Resonances", scimag.org, Jul. 6, 2007.

Lostetter, J., "Non-contact power supply," Medical Design, 2009, Retrieved from http://medicaldesign.com/print/components/non-contact-power-supply.

Miranda et al.,"Wireless power transfer using weakly coupled magnetostatic resonators", Energy Conversion Congress and Exposition (ECCE), 2010 IEEE Digital Object Identifier: 10.1109/ECCE.2010.5617728 Publication Year: 2010, pp. 4179-4186 IEEE Conferences.

Myers, G.H.; Reed, G.E.; Thumin, A.; Fascher, S; and Cortes, L., "A transcutaneous power transformer," Trans. Amer. Soc. Artif. Inter. Organs, vol. 14, 1968, pp. 210-219.

Shinohara, et al, "Experimental Study of Large Rectenna Array for Microwave Energy Transmission," 1998 IEEE Transactions on Microwave Theory and Techniques, vol. 46, pp. 261-268, Mar. 1998.

Onizuka, et al., A design methodology of chip-to-chip wireless power transmission system, Univ. of Tokyo, International Conference on Integrated Circuit Design and Technology, 2007 (ICICDT '07), IEEE, May-Jun. 2007, pp. 1-4.

Ozawa, R., et al., "Wireless Energy Transmission for Micro Aerial Vehicles Using a Microwave Phased Array," 3rd International Energy Conversion Engineering Conference, Aug. 15-18, 2005, San Francisco, CA, pp. 1-6.

Schuder J.C., et al., "High Level electromagnetic energy transfer through a closed wall", Inst.Radio Engrs. Int.Conf Record 9, pp. 119-126, 1961.

(56) References Cited

OTHER PUBLICATIONS

Schuder J.C.,"Powering an artificial heart:Birth of the inductively coupled-radio frequency system in 1960", Artificial organs, vol. 26, No. 11, 2002, pp. 909-915.
Tae-Whan Yoo et al, "Theoretical and Experimental Development of 10 and 35 GHz Rectennas," 1992 IEEE Transactions on Microwave Theory and Techniques, vol. 40, pp. 1259-1266, Jun. 1992.
Sekitani et al, "A Large-area Wireless Power-Transmission Sheet Using Printed Organic Transistors and Plastic MEMS Switches," Nature Materials Letter, pp. 413-417; Jan. 2007.
Yates et al., "Optimal transmission frequency for ultralow-power short-range radio links", Source: IEEE Transactions on Circuits and Systems I: Fundamental Theory and Applications, v 51, n 7, 1405-13, Jul. 2004; ISSN: 1057-7122; DOI: 10.1109/TCSI.2004.830696; Publisher: IEEE, USA Author affiliation: Dept. of Electr. & Electron. Eng., Imperial Coll. London, UK.
International Search Report and Written Opinion—PCT/US2014/044913—ISA/EPO—Nov. 21, 2014.

\* cited by examiner

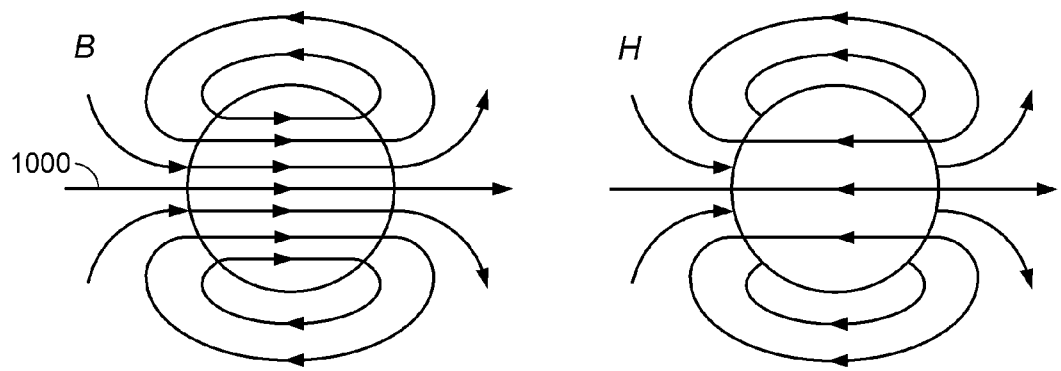
FIG. 10A  FIG. 10B
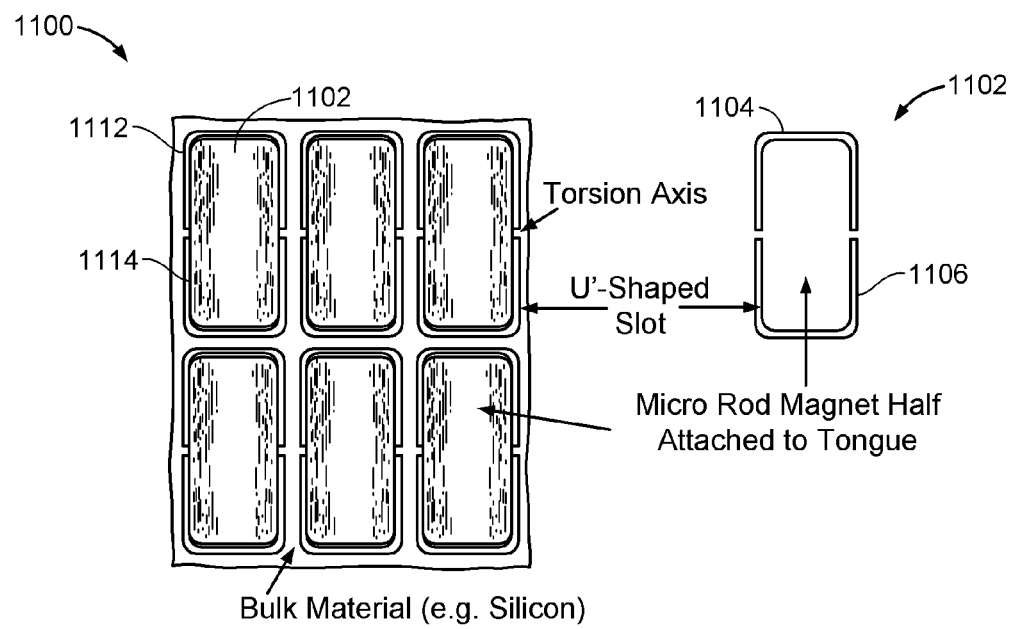
FIG. 11

WIRELESS POWER TRANSMITTER WITH A PLURALITY OF MAGNETIC OSCILLATORS

RELATED APPLICATIONS

This application claims the benefit of priority to U.S. Provisional Appl. No. 61/842,656, filed on Jul. 3, 2013 and incorporated in its entirety by reference herein.

FIELD

The present invention relates generally to wireless power. More specifically, the disclosure is directed to a wireless power transmitter using a plurality of magnetic oscillators as a magneto-mechanical system.

BACKGROUND

An increasing number and variety of electronic devices are powered via rechargeable batteries. Such devices include mobile phones, portable music players, laptop computers, tablet computers, computer peripheral devices, communication devices (e.g., Bluetooth devices), digital cameras, hearing aids, and the like. While battery technology has improved, battery-powered electronic devices increasingly require and consume greater amounts of power, thereby often requiring recharging. Rechargeable devices are often charged via wired connections through cables or other similar connectors that are physically connected to a power supply. Cables and similar connectors may sometimes be inconvenient or cumbersome and have other drawbacks. Wireless charging systems that are capable of transferring power in free space to be used to charge rechargeable electronic devices or provide power to electronic devices may overcome some of the deficiencies of wired charging solutions. As such, wireless power transfer systems and methods that efficiently and safely transfer power to electronic devices are desirable.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a power transmitter configured to wirelessly transfer power to at least one power receiver. The power transmitter comprises at least one excitation circuit configured to generate a time-varying first magnetic field in response to a time-varying electric current flowing through the at least one excitation circuit. The time-varying first magnetic field has an excitation frequency. The power transmitter further comprises a plurality of magnetic oscillators in which each magnetic oscillator of the plurality of magnetic oscillators has a mechanical resonant frequency substantially equal to the excitation frequency. The plurality of magnetic oscillators is configured to generate a time-varying second magnetic field in response to the first magnetic field.

Another aspect of the disclosure provides a method of transmitting power wirelessly. The method comprises generating a time-varying first magnetic field having an excitation frequency. The method further comprises generating a time-varying second magnetic field by applying the first magnetic field to a plurality of magnetic oscillators. Each magnetic oscillator of the plurality of magnetic oscillators has a mechanical resonant frequency substantially equal to the excitation frequency.

Another aspect of the disclosure provides a power transmitter configured to wirelessly transfer power to at least one power receiver. The power transmitter comprises means for generating a time-varying first magnetic field having an excitation frequency. The power transmitter further comprises means for generating a time-varying second magnetic field in response to the time-varying first magnetic field.

Another aspect of the disclosure provides a power receiver configured to wirelessly receive power from at least one power transmitter. The power receiver comprises at least one circuit configured to generate a time-varying electric current flowing through the at least one circuit in response to a time-varying first magnetic field. The time-varying first magnetic field has a frequency. The power receiver further comprises a plurality of magnetic oscillators, each magnetic oscillator of the plurality of magnetic oscillators having a mechanical resonant frequency substantially equal to the frequency. The plurality of magnetic oscillators is configured to generate the time-varying first magnetic field in response to a time-varying second magnetic field. The plurality of magnetic oscillators is arranged in a three-dimensional array comprising at least one first plane comprising a first set of magnetic oscillators of the plurality of magnetic oscillators. Each magnetic oscillator of the first set of magnetic oscillators has a magnetic moment pointing in a first direction, and the first set of magnetic oscillators has a first summed magnetic moment comprising a time-varying component and a time-invariant component. The three-dimensional array further comprises at least one second plane comprising a second set of magnetic oscillators of the plurality of magnetic oscillators. Each magnetic oscillator of the second set of magnetic oscillators has a magnetic moment pointing in a second direction, the second set of magnetic oscillators having a second summed magnetic moment comprising a time-varying component and a time-invariant component. The time-invariant component of the first summed magnetic moment and the time-invariant component of the second summed magnetic moment have substantially equal magnitudes and point in substantially opposite directions.

Another aspect of the disclosure provides a method of wirelessly receiving power. The method comprises generating a time-varying electric current flowing in response to a time-varying first magnetic field. The time-varying first magnetic field has a frequency. The method further comprises using a plurality of magnetic oscillators to generate the time-varying first magnetic field in response to a time-varying second magnetic field. Each magnetic oscillator of the plurality of magnetic oscillators has a mechanical resonant frequency substantially equal to the frequency. The plurality of magnetic oscillators is arranged in a three-dimensional array comprising at least one first plane comprising a first set of magnetic oscillators of the plurality of magnetic oscillators. Each magnetic oscillator of the first set of magnetic oscillators has a magnetic moment pointing in a first direction, and the first set of magnetic oscillators has a first summed magnetic moment comprising a time-varying component and a time-invariant component. The three-dimensional array further comprises at least one second plane comprising a second set of magnetic oscillators of the plurality of magnetic oscillators. Each magnetic oscillator of the second set of magnetic oscillators has a magnetic moment pointing in a second direction, the second set of magnetic oscillators having a second summed magnetic moment comprising a time-varying component and a time-invariant component. The time-invariant component of the first summed magnetic moment and the time-invariant component of the second summed magnetic moment have substantially equal magnitudes and point in substantially opposite directions.

Another aspect of the disclosure provides a power receiver configured to wirelessly receive power from at least one power transmitter. The power receiver comprises means for generating a time-varying electric current flowing in response to a time-varying first magnetic field. The time-varying first magnetic field has a frequency. The power receiver further comprises means for generating the time-varying first magnetic field in response to a time-varying second magnetic field. In certain configurations, the means for generating the time-varying first magnetic field can comprise a plurality of magnetic oscillators in which each magnetic oscillator has a mechanical resonant frequency substantially equal to the frequency. The plurality of magnetic oscillators can be arranged in a three-dimensional array comprising at least one first plane comprising a first set of magnetic oscillators of the plurality of magnetic oscillators. Each magnetic oscillator of the first set of magnetic oscillators has a magnetic moment pointing in a first direction, and the first set of magnetic oscillators has a first summed magnetic moment comprising a time-varying component and a time-invariant component. The three-dimensional array can further comprise at least one second plane comprising a second set of magnetic oscillators of the plurality of magnetic oscillators. Each magnetic oscillator of the second set of magnetic oscillators has a magnetic moment pointing in a second direction, the second set of magnetic oscillators having a second summed magnetic moment comprising a time-varying component and a time-invariant component. The time-invariant component of the first summed magnetic moment and the time-invariant component of the second summed magnetic moment have substantially equal magnitudes and point in substantially opposite directions.

Another aspect of the disclosure provides a power transfer system comprising at least one power transmitter and at least one power receiver. The at least one power transmitter comprises at least one first circuit configured to generate a time-varying first magnetic field in response to a time-varying first electric current flowing through the at least one first circuit. The first magnetic field has a first excitation frequency. The at least one power transmitter further comprises a first plurality of magnetic oscillators, each magnetic oscillator of the first plurality of magnetic oscillators having a first mechanical resonant frequency substantially equal to the first excitation frequency. The first plurality of magnetic oscillators is configured to generate a time-varying second magnetic field in response to the first magnetic field. The at least one power receiver comprises at least one second circuit configured to generate a time-varying second electric current flowing through the at least one second circuit in response to a time-varying third magnetic field. The at least one power receiver further comprises a second plurality of magnetic oscillators, each magnetic oscillator of the second plurality of magnetic oscillators having a second mechanical resonant frequency substantially equal to the first mechanical resonant frequency. The second plurality of magnetic oscillators is configured to generate the third magnetic field in response to the second magnetic field.

BRIEF DESCRIPTION OF THE DRAWINGS

FIG. 10A schematically illustrates the parallel magnetic flux lines (B) inside a magnetized sphere.

FIG. 10B schematically illustrates the magnetic field strength (H) in a magnetized sphere.

FIG. 11 schematically illustrates an example array of magnetic oscillators fabricated using MEMS technology in accordance with certain embodiments described herein.

Figure 1:
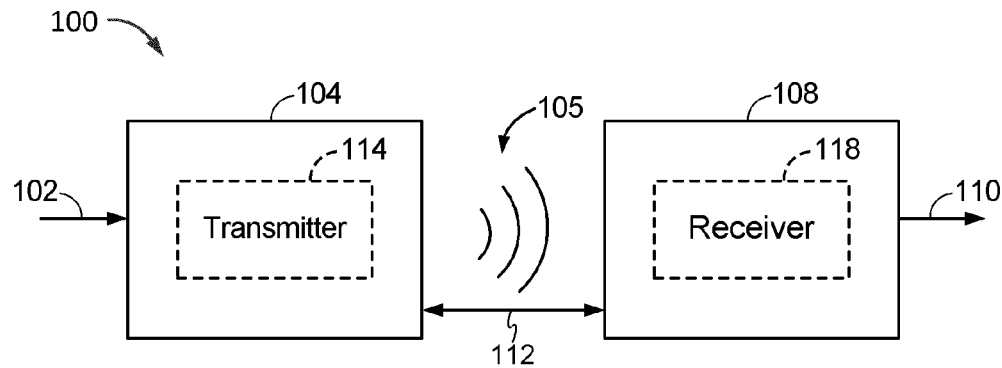
FIG. 1 is a functional block diagram of an exemplary wireless power transfer system, in accordance with exemplary embodiments of the invention.

The various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The detailed description set forth below in connection with the appended drawings is intended as a description of exemplary embodiments of the invention and is not intended to represent the only embodiments in which the invention may be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. In some instances, some devices are shown in block diagram form.

Wirelessly transferring power may refer to transferring any form of energy associated with electric fields, magnetic fields, electromagnetic fields, or otherwise from a transmitter to a receiver without the use of physical electrical conductors (e.g., power may be transferred through free space). The power output into a wireless field (e.g., a magnetic field) may be received, captured by, or coupled by a "receiving antenna" to achieve power transfer.

FIG. 1 is a functional block diagram of an exemplary wireless power transfer system 100, in accordance with exemplary embodiments of the invention. Input power 102 may be provided to a transmitter 104 from a power source (not shown) for generating a field 105 for providing energy transfer. A receiver 108 may couple to the field 105 and generate output power 110 for storing or consumption by a device (not shown) coupled to the output power 110. Both the transmitter 104 and the receiver 108 are separated by a distance 112. In one exemplary embodiment, transmitter 104 and receiver 108 are configured according to a mutual resonant relationship. When the resonant frequency of receiver 108 and the resonant frequency of transmitter 104 are substantially the same or very close, transmission losses between the transmitter 104 and the receiver 108 are minimal. As such, wireless power transfer may be provided over larger distance in contrast to purely inductive solutions that may require large coils to be very close (e.g., mms). Resonant inductive coupling techniques may thus allow for improved efficiency and power transfer over various distances and with a variety of inductive coil configurations.

The receiver 108 may receive power when the receiver 108 is located in an energy field 105 produced by the transmitter 104. The field 105 corresponds to a region where energy output by the transmitter 104 may be captured by a receiver 105. In some cases, the field 105 may correspond to the "near-field" of the transmitter 104 as will be further described below. The transmitter 104 may include a transmit antenna 114 for outputting an energy transmission. The receiver 108 further includes a receive antenna 118 for receiving or capturing energy from the energy transmission. The near-field may correspond to a region in which there are strong reactive fields resulting from the currents and charges in the transmit antenna 114 that minimally radiate power away from the transmit antenna 114. In some cases the near-field may correspond to a region that is within about one wavelength (or a fraction thereof) of the transmit antenna 114. The transmit and receive antennas 114 and 118 are sized according to applications and devices to be associated therewith. As described above, efficient energy transfer may occur by coupling a large portion of the energy in a field 105 of the transmit antenna 114 to a receive antenna 118 rather than propagating most of the energy in an electromagnetic wave to the far field. When positioned within the field 105, a "coupling mode" may be developed between the transmit antenna 114 and the receive antenna 118. The area around the transmit and receive antennas 114 and 118 where this coupling may occur is referred to herein as a coupling-mode region.

Figure 2:
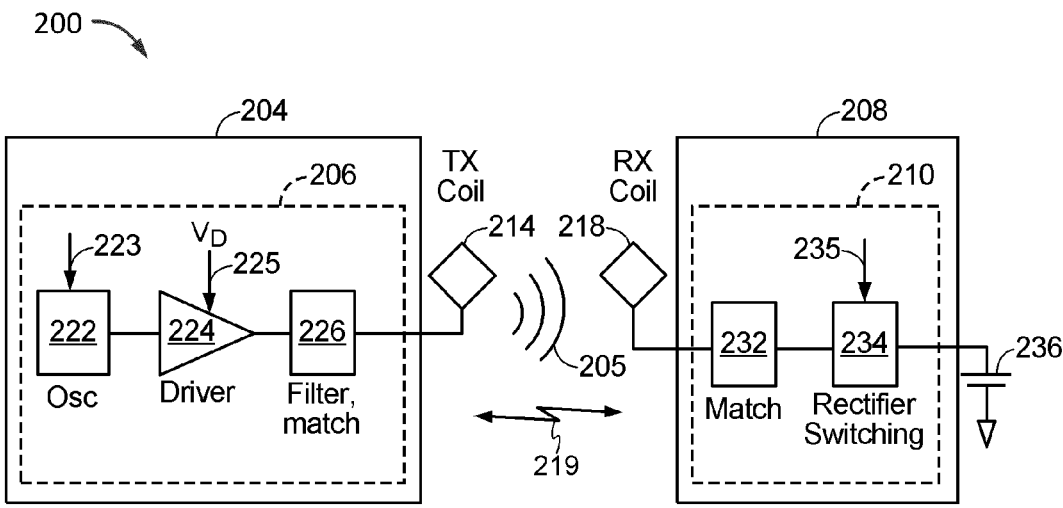
FIG. 2 is a functional block diagram of exemplary components that may be used in the wireless power transfer system of FIG. 1, in accordance with various exemplary embodiments of the invention.

FIG. 2 is a functional block diagram of exemplary components that may be used in the wireless power transfer system 100 of FIG. 1, in accordance with various exemplary embodiments of the invention. The transmitter 204 may include transmit circuitry 206 that may include an oscillator 222, a driver circuit 224, and a filter and matching circuit 226. The oscillator 222 may be configured to generate a signal at a desired frequency, such as 40 kHz, 85 kHz, 140 kHz, 468.75 KHz, 6.78 MHz or 13.56 MHz, that may be adjusted in response to a frequency control signal 223. The oscillator signal may be provided to a driver circuit 224 configured to drive the transmit antenna 214 at, for example, a resonant frequency of the transmit antenna 214. The driver circuit 224 may be a switching amplifier configured to receive a square wave from the oscillator 222 and output a sine wave. For example, the driver circuit 224 may be a class E amplifier. A filter and matching circuit 226 may be also included to filter out harmonics or other unwanted frequencies and match the impedance of the transmitter 204 to the transmit antenna 214. As a result of driving the transmit antenna 214, the transmitter 204 may wirelessly output power at a level sufficient for charging or powering an electronic device. As one example, the power provided may be for example on the order of 300 milliWatts to 5 Watts to power or charge different devices with different power requirements. Higher or lower power levels in the kilowatt range (e.g., for wireless charging of electric vehicles) may also be provided.

The receiver 208 may include receive circuitry 210 that may include a matching circuit 232 and a rectifier and switching circuit 234 to generate a DC power output from an AC power input to charge a battery 236 as shown in FIG. 2 or to power a device (not shown) coupled to the receiver 108. The matching circuit 232 may be included to match the impedance of the receive circuitry 210 to the receive antenna 218. The receiver 208 and transmitter 204 may additionally communicate on a separate communication channel 219 (e.g., Bluetooth, zigbee, cellular, etc.). The receiver 208 and transmitter 204 may alternatively communicate via in-band signaling using characteristics of the wireless field 206.

As described more fully below, receiver 208, that may initially have a selectively disabled associated load (e.g., battery 236), may be configured to determine whether an amount of power transmitted by transmitter 204 and received by receiver 208 is appropriate for charging a battery 236. Further, receiver 208 may be configured to enable a load (e.g., battery 236) upon determining that the amount of power is appropriate. In some embodiments, a receiver 208 may be configured to directly utilize power received from a wireless power transfer field without charging of a battery 236. For example, a communication device, such as a near-field communication (NFC) or radio-frequency identification device (RFID may be configured to receive power from a wireless power transfer field and communicate by interacting with the wireless power transfer field and/or utilize the received power to communicate with a transmitter 204 or other devices.

Figure 3:
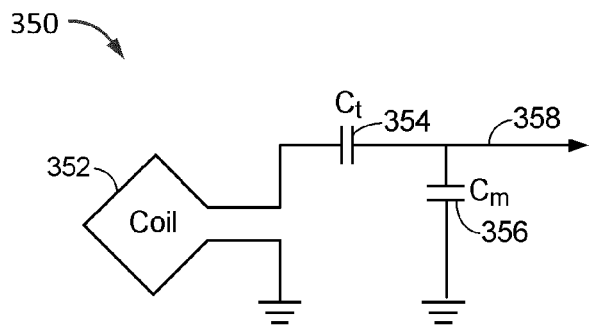
FIG. 3 is a schematic diagram of a portion of transmit circuitry or receive circuitry of FIG. 2 including a transmit or receive antenna, in accordance with exemplary embodiments of the invention.

FIG. 3 is a schematic diagram of a portion of transmit circuitry 206 or receive circuitry 210 of FIG. 2 including a transmit or receive antenna 352, in accordance with exemplary embodiments of the invention. As illustrated in FIG. 3, transmit or receive circuitry 350 used in exemplary embodiments including those described below may include an antenna 352. The antenna 352 may also be referred to or be configured as a "loop" antenna 352. The antenna 352 may also be referred to herein or be configured as a "magnetic" antenna or an induction coil. The term "antenna" generally refers to a component that may wirelessly output or receive energy for coupling to another "antenna." The antenna may also be referred to as a coil of a type that is configured to wirelessly output or receive power. As used herein, an antenna 352 is an example of a "power transfer component" of a type that is configured to wirelessly output and/or receive power. The antenna 352 may be configured to include an air core or a physical core such as a ferrite core (not shown). Air core loop antennas may be more tolerable to extraneous physical devices placed in the vicinity of the core. Furthermore, an air core loop antenna 352 allows the placement of other components within the core area. In addition, an air core loop may more readily enable placement of the receive antenna 218 (FIG. 2) within a plane of the transmit antenna 214 (FIG. 2) where the coupled-mode region of the transmit antenna 214 (FIG. 2) may be more powerful.

As stated, efficient transfer of energy between the transmitter 104 and receiver 108 may occur during matched or nearly matched resonance between the transmitter 104 and the receiver 108. However, even when resonance between the transmitter 104 and receiver 108 are not matched, energy may be transferred, although the efficiency may be affected. Transfer of energy occurs by coupling energy from the field 105 of the transmit antenna 214 coil to the receive antenna 218 residing in the neighborhood where this field 105 is established rather than propagating the energy from the transmit antenna 214 into free space.

The resonant frequency of the loop or magnetic antennas is based on the inductance and capacitance. Inductance may be simply the inductance created by the antenna 352, whereas, capacitance may be added to the antenna's inductance to create a resonant structure at a desired resonant frequency. As a non-limiting example, capacitor 352 and capacitor 354 may be added to the transmit or receive circuitry 350 to create a resonant circuit that selects a signal 356 at a resonant frequency. Accordingly, for larger diameter antennas, the size of capacitance needed to sustain resonance may decrease as the diameter or inductance of the loop increases. Furthermore, as the diameter of the antenna increases, the efficient energy transfer area of the near-field may increase. Other resonant circuits formed using other components (e.g., magnetic oscillators in accordance with certain embodiments described herein) are also possible. As another non-limiting example, a capacitor may be placed in parallel between the two terminals of the antenna 350. For transmit antennas, a signal 358 with a frequency that substantially corresponds to the resonant frequency of the antenna 352 may be an input to the antenna 352.

In one embodiment, the transmitter 104 may be configured to output a time varying magnetic field with a frequency corresponding to the resonant frequency of the transmit antenna 114. When the receiver is within the field 105, the time varying magnetic field may induce a current in the receive antenna 118. As described above, if the receive antenna 118 is configured to be resonant at the frequency of the transmit antenna 118, energy may be efficiently transferred. The AC signal induced in the receive antenna 118 may be rectified as described above to produce a DC signal that may be provided to charge or to power a load.

Figure 4:
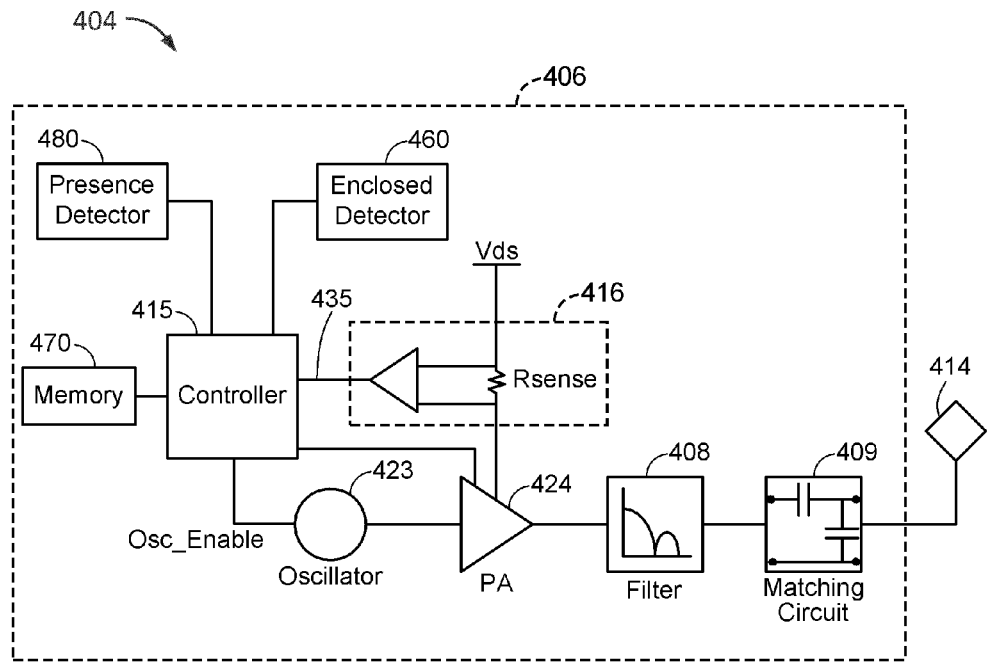
FIG. 4 is a functional block diagram of a transmitter that may be used in the wireless power transfer system of FIG. 1, in accordance with exemplary embodiments of the invention.

FIG. 4 is a functional block diagram of a transmitter 404 that may be used in the wireless power transfer system of FIG. 1, in accordance with exemplary embodiments of the invention. The transmitter 404 may include transmit circuitry 406 and a transmit antenna 414. The transmit antenna 414 may be the antenna 352 as shown in FIG. 3. Transmit circuitry 406 may provide RF power to the transmit antenna 414 by providing an oscillating signal resulting in generation of energy (e.g., magnetic flux) about the transmit antenna 414. Transmitter 404 may operate at any suitable frequency. By way of example, transmitter 404 may operate at the 6.78 MHz ISM band.

Transmit circuitry 406 may include a fixed impedance matching circuit 409 for matching the impedance of the transmit circuitry 406 (e.g., 50 ohms) to the transmit antenna 414 and a low pass filter (LPF) 408 configured to reduce harmonic emissions to levels to prevent self-jamming of devices coupled to receivers 108 (FIG. 1). Other exemplary embodiments may include different filter topologies, including but not limited to, notch filters that attenuate specific frequencies while passing others and may include an adaptive impedance match, that may be varied based on measurable transmit metrics, such as output power to the antenna 414 or DC current drawn by the driver circuit 424. Transmit circuitry 406 further includes a driver circuit 424 configured to drive an RF signal as determined by an oscillator 423. The transmit circuitry 406 may be comprised of discrete devices or circuits, or alternately, may be comprised of an integrated assembly. An exemplary RF power output from transmit antenna 414 may be on the order of 2.5 Watts.

Transmit circuitry 406 may further include a controller 415 for selectively enabling the oscillator 423 during transmit phases (or duty cycles) for specific receivers, for adjusting the frequency or phase of the oscillator 423, and for adjusting the output power level for implementing a communication protocol for interacting with neighboring devices through their attached receivers. It is noted that the controller 415 may also be referred to herein as processor 415. Adjustment of oscillator phase and related circuitry in the transmission path may allow for reduction of out of band emissions, especially when transitioning from one frequency to another.

The transmit circuitry 406 may further include a load sensing circuit 416 for detecting the presence or absence of active receivers in the vicinity of the near-field generated by transmit antenna 414. By way of example, a load sensing circuit 416 monitors the current flowing to the driver circuit 424, that may be affected by the presence or absence of active receivers in the vicinity of the field generated by transmit antenna 414 as will be further described below. Detection of changes to the loading on the driver circuit 424 are monitored by controller 415 for use in determining whether to enable the oscillator 423 for transmitting energy and to communicate with an active receiver. As described more fully below, a current measured at the driver circuit 424 may be used to determine whether an invalid device is positioned within a wireless power transfer region of the transmitter 404.

The transmit antenna 414 may be implemented with a Litz wire or as an antenna strip with the thickness, width and metal type selected to keep resistive losses low. In a one implementation, the transmit antenna 414 may generally be configured for association with a larger structure such as a table, mat, lamp or other less portable configuration. Accordingly, the transmit antenna 414 generally may not need "turns" in order to be of a practical dimension. An exemplary implementation of a transmit antenna 414 may be "electrically small" (i.e., fraction of the wavelength) and tuned to resonate at lower usable frequencies by using capacitors to define the resonant frequency. A transmit antenna may also use a system of magnetic oscillators in accordance with exemplary embodiments described herein.

The transmitter 404 may gather and track information about the whereabouts and status of receiver devices that may be associated with the transmitter 404. Thus, the transmit circuitry 406 may include a presence detector 480, an enclosed detector 460, or a combination thereof, connected to the controller 415 (also referred to as a processor herein). The controller 415 may adjust an amount of power delivered by the driver circuit 424 in response to presence signals from the presence detector 480 and the enclosed detector 460. The transmitter 404 may receive power through a number of power sources, such as, for example, an AC-DC converter (not shown) to convert conventional AC power present in a building, a DC-DC converter (not shown) to convert a conventional DC power source to a voltage suitable for the transmitter 404, or directly from a conventional DC power source (not shown).

As a non-limiting example, the presence detector 480 may be a motion detector utilized to sense the initial presence of a device to be charged that is inserted into the coverage area of the transmitter 404. After detection, the transmitter 404 may be turned on and the RF power received by the device may be used to toggle a switch on the Rx device in a pre-determined manner, which in turn results in changes to the driving point impedance of the transmitter 404.

As another non-limiting example, the presence detector 480 may be a detector capable of detecting a human, for example, by infrared detection, motion detection, or other suitable means. In some exemplary embodiments, there may be regulations limiting the amount of power that a transmit antenna 414 may transmit at a specific frequency. In some cases, these regulations are meant to protect humans from electromagnetic radiation. However, there may be environments where a transmit antenna 414 is placed in areas not occupied by humans, or occupied infrequently by humans, such as, for example, garages, factory floors, shops, and the like. If these environments are free from humans, it may be permissible to increase the power output of the transmit antenna 414 above the normal power restrictions regulations. In other words, the controller 415 may adjust the power output of the transmit antenna 414 to a regulatory level or lower in response to human presence and adjust the power output of the transmit antenna 414 to a level above the regulatory level when a human is outside a regulatory distance from the electromagnetic field of the transmit antenna 414.

As a non-limiting example, the enclosed detector 460 (may also be referred to herein as an enclosed compartment detector or an enclosed space detector) may be a device such as a sense switch for determining when an enclosure is in a closed or open state. When a transmitter is in an enclosure that is in an enclosed state, a power level of the transmitter may be increased.

In exemplary embodiments, a method by which the transmitter 404 does not remain on indefinitely may be used. In this case, the transmitter 404 may be programmed to shut off after a user-determined amount of time. This feature prevents the transmitter 404, notably the driver circuit 424, from running long after the wireless devices in its perimeter are fully charged. This event may be due to the failure of the circuit to detect the signal sent from either the repeater or the receive antenna 218 that a device is fully charged. To prevent the transmitter 404 from automatically shutting down if another device is placed in its perimeter, the transmitter 404 automatic shut off feature may be activated only after a set period of lack of motion detected in its perimeter. The user may be able to determine the inactivity time interval, and change it as desired. As a non-limiting example, the time interval may be longer than that needed to fully charge a specific type of wireless device under the assumption of the device being initially fully discharged.

Figure 5:
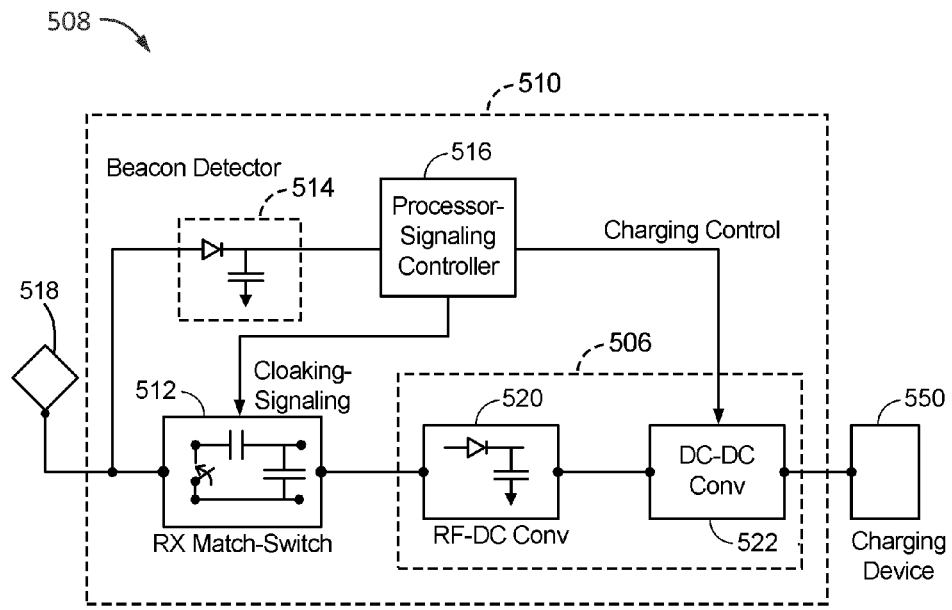
FIG. 5 is a functional block diagram of a receiver that may be used in the wireless power transfer system of FIG. 1, in accordance with exemplary embodiments of the invention.

FIG. 5 is a functional block diagram of a receiver 508 that may be used in the wireless power transfer system of FIG. 1, in accordance with exemplary embodiments of the invention. The receiver 508 includes receive circuitry 510 that may include a receive antenna 518. Receiver 508 further couples to device 550 for providing received power thereto. It should be noted that receiver 508 is illustrated as being external to device 550 but may be integrated into device 550. Energy may be propagated wirelessly to receive antenna 518 and then coupled through the rest of the receive circuitry 510 to device 550. By way of example, the charging device may include devices such as mobile phones, portable music players, laptop computers, tablet computers, computer peripheral devices, communication devices (e.g., Bluetooth devices), digital cameras, hearing aids (an other medical devices), and the like.

Receive antenna 518 may be tuned to resonate at the same frequency, or within a specified range of frequencies, as transmit antenna 414 (FIG. 4). Receive antenna 518 may be similarly dimensioned with transmit antenna 414 or may be differently sized based upon the dimensions of the associated device 550. By way of example, device 550 may be a portable electronic device having diametric or length dimension smaller than the diameter or length of transmit antenna 414. In such an example, receive antenna 518 may be implemented as a multi-turn coil in order to reduce the capacitance value of a tuning capacitor (not shown) and increase the receive coil's impedance. By way of example, receive antenna 518 may be placed around the substantial circumference of device 550 in order to maximize the antenna diameter and reduce the number of loop turns (i.e., windings) of the receive antenna 518 and the inter-winding capacitance.

Receive circuitry 510 may provide an impedance match to the receive antenna 518. Receive circuitry 510 includes power conversion circuitry 506 for converting a received RF energy source into charging power for use by the device 550. Power conversion circuitry 506 includes an RF-to-DC converter 520 and may also include a DC-to-DC converter 522. RF-to-DC converter 520 rectifies the RF energy signal received at receive antenna 518 into a non-alternating power with an output voltage represented by $V_{rect}$. The DC-to-DC converter 522 (or other power regulator) converts the rectified RF energy signal into an energy potential (e.g., voltage) that is compatible with device 550 with an output voltage and output current represented by $V_{out}$ and $I_{out}$. Various RF-to-DC converters are contemplated, including partial and full rectifiers, regulators, bridges, doublers, as well as linear and switching converters.

Receive circuitry 510 may further include switching circuitry 512 for connecting receive antenna 518 to the power conversion circuitry 506 or alternatively for disconnecting the power conversion circuitry 506. Disconnecting receive antenna 518 from power conversion circuitry 506 not only suspends charging of device 550, but also changes the "load" as "seen" by the transmitter 404 (FIG. 2).

As disclosed above, transmitter 404 includes load sensing circuit 416 that may detect fluctuations in the bias current provided to transmitter driver circuit 424. Accordingly, transmitter 404 has a mechanism for determining when receivers are present in the transmitter's near-field.

When multiple receivers 508 are present in a transmitter's near-field, it may be desirable to time-multiplex the loading and unloading of one or more receivers to enable other receivers to more efficiently couple to the transmitter. A receiver 508 may also be cloaked in order to eliminate coupling to other nearby receivers or to reduce loading on nearby transmitters. This "unloading" of a receiver is also known herein as a "cloaking." Furthermore, this switching between unloading and loading controlled by receiver 508 and detected by transmitter 404 may provide a communication mechanism from receiver 508 to transmitter 404 as is explained more fully below. Additionally, a protocol may be associated with the switching that enables the sending of a message from receiver 508 to transmitter 404. By way of example, a switching speed may be on the order of 100 μsec.

In an exemplary embodiment, communication between the transmitter 404 and the receiver 508 refers to a device sensing and charging control mechanism, rather than conventional two-way communication (i.e., in band signaling using the coupling field). In other words, the transmitter 404 may use on/off keying of the transmitted signal to adjust whether energy is available in the near-field. The receiver may interpret these changes in energy as a message from the transmitter 404. From the receiver side, the receiver 508 may use tuning and de-tuning of the receive antenna 518 to adjust how much power is being accepted from the field. In some cases, the tuning and de-tuning may be accomplished via the switching circuitry 512. The transmitter 404 may detect this difference in power used from the field and interpret these changes as a message from the receiver 508. It is noted that other forms of modulation of the transmit power and the load behavior may be utilized.

Receive circuitry 510 may further include signaling detector and beacon circuitry 514 used to identify received energy fluctuations that may correspond to informational signaling from the transmitter to the receiver. Furthermore, signaling and beacon circuitry 514 may also be used to detect the transmission of a reduced RF signal energy (i.e., a beacon signal) and to rectify the reduced RF signal energy into a nominal power for awakening either un-powered or power-depleted circuits within receive circuitry 510 in order to configure receive circuitry 510 for wireless charging.

Receive circuitry 510 further includes processor 516 for coordinating the processes of receiver 508 described herein including the control of switching circuitry 512 described herein. Cloaking of receiver 508 may also occur upon the occurrence of other events including detection of an external wired charging source (e.g., wall/USB power) providing charging power to device 550. Processor 516, in addition to controlling the cloaking of the receiver, may also monitor beacon circuitry 514 to determine a beacon state and extract messages sent from the transmitter 404. Processor 516 may also adjust the DC-to-DC converter 522 for improved performance.

Figure 6:
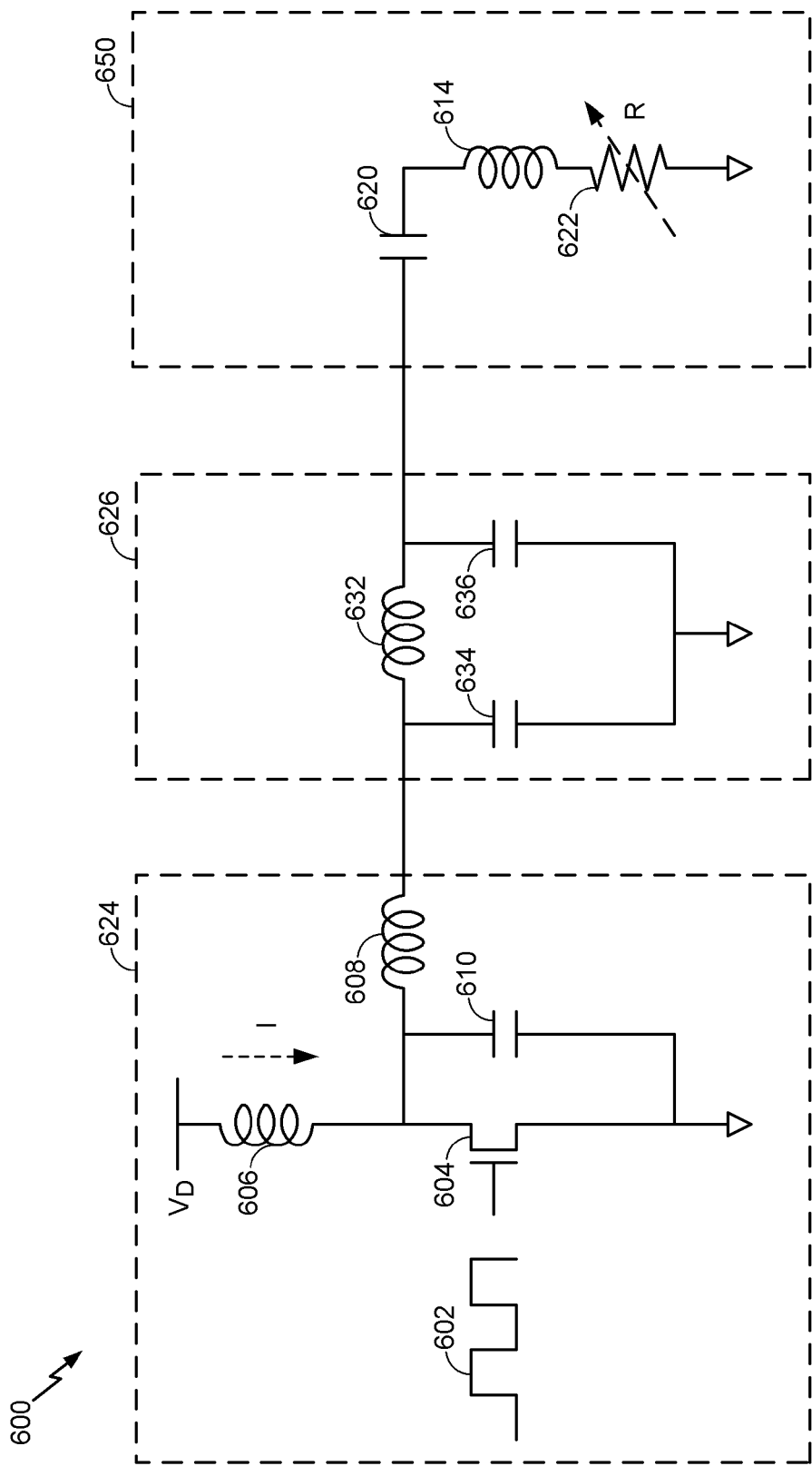
FIG. 6 is a schematic diagram of a portion of transmit circuitry that may be used in the transmit circuitry of FIG. 4.

FIG. 6 is a schematic diagram of a portion of transmit circuitry 600 that may be used in the transmit circuitry 406 of FIG. 4. The transmit circuitry 600 may include a driver circuit 624 as described above in FIG. 4. As described above, the driver circuit 624 may be a switching amplifier that may be configured to receive a square wave and output a sine wave to be provided to the transmit circuit 650. In some cases the driver circuit 624 may be referred to as an amplifier circuit. The driver circuit 624 is shown as a class E amplifier, however, any suitable driver circuit 624 may be used in accordance with embodiments of the invention. The driver circuit 624 may be driven by an input signal 602 from an oscillator 423 as shown in FIG. 4. The driver circuit 624 may also be provided with a drive voltage $V_D$ that is configured to control the maximum power that may be delivered through a transmit circuit 650. To eliminate or reduce harmonics, the transmit circuitry 600 may include a filter circuit 626. The filter circuit 626 may be a three pole (capacitor 634, inductor 632, and capacitor 636) low pass filter circuit 626.

The signal output by the filter circuit 626 may be provided to a transmit circuit 650 comprising an antenna 614. The transmit circuit 650 may include a series resonant circuit having a capacitance 620 and inductance (e.g., that may be due to the inductance or capacitance of the antenna or to an additional capacitor component) that may resonate at a frequency of the filtered signal provided by the driver circuit 624. The load of the transmit circuit 650 may be represented by the variable resistor 622. The load may be a function of a wireless power receiver 508 that is positioned to receive power from the transmit circuit 650.

Figure 7:
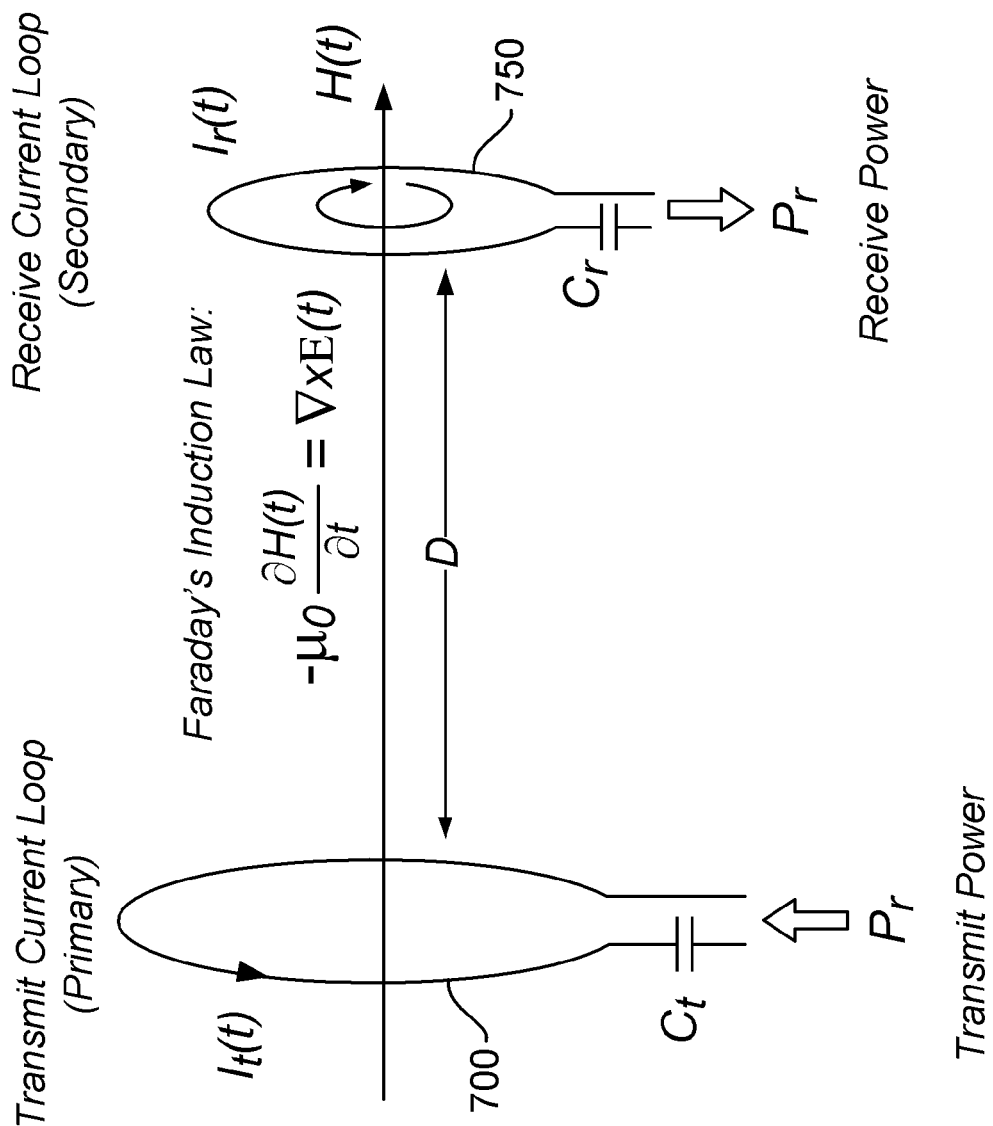
FIG. 7 illustrates non-radiative inductive power transfer based on Faraday's law using capacitively loaded wire loops at both the transmit and receive sides.

FIG. 7 illustrates non-radiative energy transfer that is based on Faraday's induction law, which can be expressed as:

$$-\mu_0 \frac{\partial H(t)}{\partial t} = \nabla \times E(t)$$

where $\nabla \times E(t)$ denotes curl of the electric field generated by the alternating magnetic field. A transmitter forms a primary and a receiver forms a secondary separated by a transmission distance. The primary represents the transmit antenna generating an alternating magnetic field. The secondary represents the receive antenna that extracts electrical power from the alternating magnetic field using Faraday's induction law.

The generally weak coupling that exists between the primary and secondary may be considered as a stray inductance. This stray inductance, in turn, increases the reactance, which itself may hamper the energy transfer between primary and secondary. The transfer efficiency of this kind of weakly coupled system can be improved by using capacitors that are tuned to the precise opposite of the reactance of the operating frequency. When a system is tuned in this way, it becomes a compensated transformer which is resonant at its operating frequency. The power transfer efficiency is then only limited by losses in the primary and secondary. These losses are themselves defined by their quality or Q factors and the coupling factor between the primary and the secondary. Different tuning approaches may be used. Examples include, but are not limited to, compensation of the full reactance as seen at the primary or secondary (e.g., when either is open-circuited), and compensation of stray inductance. Compensation may also be considered as part of the source and load impedance matching in order to maximize the power transfer. Impedance matching in this way can hence increase the amount of power transfer.

As the distance D between the transmitter 700 and the receiver 750 increases, the efficiency of the transmission can decrease. At increased distances, larger loops, and/or larger Q factors may be used to improve the efficiency. However, when these devices are incorporated into a portable device, the size of the loop, thus its coupling and its Q-factor, may be limited by the parameters of the portable device.

Efficiency can be improved by reducing antenna losses. In general, losses can be attributed to imperfectly conducting materials, and eddy currents in the proximity of the loop. At lower frequencies (e.g., such as less than 1 MHz), flux magnification materials such as ferrite materials can be used to artificially increase the size of the antenna. Eddy current losses may inherently be reduced by concentrating the magnetic field. Special kinds of wire can also be used to lower the resistance, such as stranded or Litz wire at low frequencies to mitigate skin effect.

An alternative to resonant inductive energy transfer uses a magneto-mechanical system as described herein. The magneto-mechanical system may be part of an energy receiving system that picks up energy from an alternating magnetic field, converts it to mechanical energy, and then reconverts to electrical energy using Faraday's induction law.

According to an embodiment, the magneto mechanical system is formed of a magnet, e.g. a permanent magnet, which is mounted in a way that allows it to oscillate under the force of an external alternating magnetic field. This transforms energy from the magnetic field into mechanical energy. In an embodiment, this oscillation uses rotational moment around an axis perpendicular to the vector of the magnetic dipole moment m, and is also positioned in the center of gravity of the magnet. This allows equilibrium and thus minimizes the effect of the gravitational force. A magnetic field applied to this system produces a torque of $T=\mu_0(m \times H)$. This torque tends to align the magnetic dipole moment of the elementary magnet along the direction of the field vector. Assuming an alternating magnetic field, the torque accelerates the moving magnet(s), thereby transforming the oscillating magnetic energy into mechanical energy.

Figure 8:
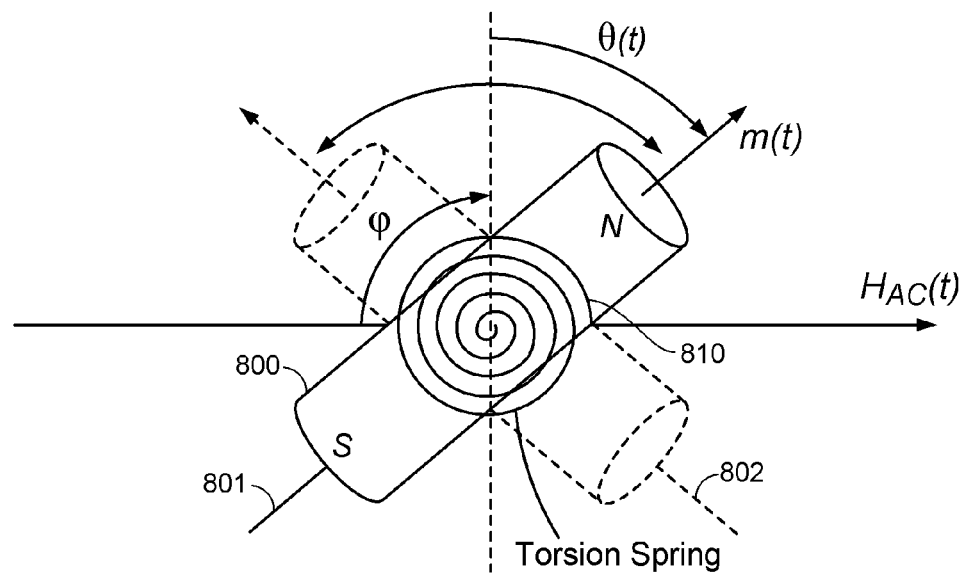
FIG. 8 schematically illustrates an example magnetic oscillator in accordance with certain embodiments described herein.

FIG. 8 schematically illustrates an example magnetic oscillator in accordance with certain embodiments described herein. The magnetic oscillator of FIG. 8 comprises a magnet 800 having a magnetic moment m(t) (e.g., a vector having a constant magnitude but an angle that is time-varying, such as a magnetic dipole moment) and the magnet 800 is mechanically coupled to an underlying substrate (not shown) by at least one spring (e.g., a torsion spring 810). This spring holds the magnet in position shown as 801 when no torque from the magnetic field is applied. This no-torque position 801 is considered 0. Magnetic torque causes the magnet 800 to move against the restoring force of the spring, to the position 802, against the force of the spring with spring constant $K_R$. The magnetic oscillator can be considered to be a torsion pendulum with an inertial moment I and exhibiting a resonance at a frequency proportional to $K_R$ and I. Frictional losses and in most cases a very weak electromagnetic radiation is caused by the oscillating magnetic moment. If this magnetic oscillator is subjected to an alternating field $H_{AC}(t)$ with a frequency near the resonance of the magnetic oscillator, then the magnetic oscillator will oscillate with an angular displacement θ(t) depending on the intensity of the applied magnetic field and reaching a maximum peak displacement at resonance.

Figure 9:
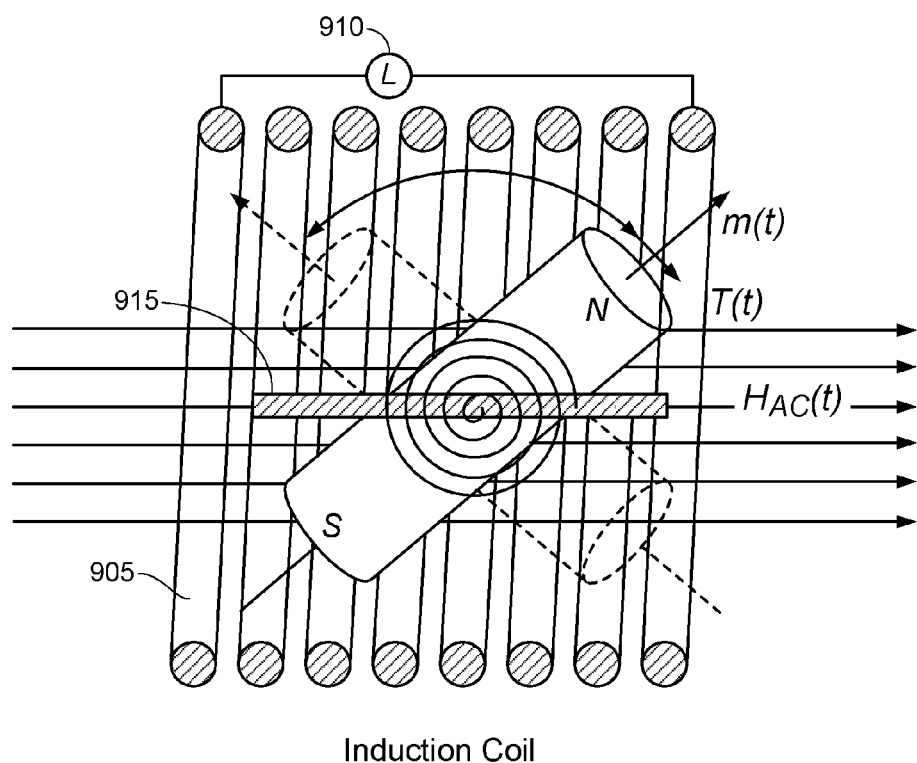
FIG. 9 schematically illustrates an example magnetic oscillator (e.g., a portion of a plurality of magnetic oscillators) with a coupling coil wound around (e.g., surrounding) the magnetic oscillator in accordance with certain embodiments described herein.

According to another embodiment, some or all of the restoring force of the spring can be replaced by an additional static magnetic field $H_0$. This static magnetic field can be oriented to provide the torque $T_0=\mu_0(m \times H_0)$. Another embodiment may use both the spring and a static magnetic field to produce the restoring force of the magnetic oscillator. The mechanical energy is reconverted into electrical energy using Faraday induction, e.g. the Dynamo principle. This can be used for example an induction coil 905 wound around the magneto-electrical system 900 as shown in FIG. 9. A load such as 910 can be connected across the coil 905. This load appears as a mechanical torque dampening the system and lowering the Q factor of the magnetic oscillator. In addition, when magnets are oscillating and thus generating a strong alternating magnetic field component and if the magnets are electrically conducting, eddy currents in the magnets will occur. These eddy currents will also contribute to system losses.

In general, some eddy currents may be also produced by the alternating magnetic field that results from the current in the coupling coil. Smaller magnets in the magneto-mechanical system may reduce eddy current effects. According to an embodiment, an array of smaller magnets is used in order to minimize this loss effect.

A magneto-mechanical system will exhibit saturation if the angular displacement of the magnet reaches a peak value. This peak value can be determined from the direction and intensity of the external H field or by the presence of a displacement stopper such as 915 to protect the torsion spring against plastic deformation. This may also be limited by the packaging, such as the limited available space for a magnet element. Electric breaking by modifying the electric loading may be considered an alternative method to control saturation and thus prevent damaging the magneto-mechanical system.

According to one embodiment and assuming a loosely coupled regime (e.g., weak coupling, such as in the case of energy harvesting from an external magnetic field generated by a large loop antenna surrounding a large space), optimum matching may be obtained when the loaded Q becomes half of the unloaded Q. According to an embodiment, the induction coil is designed to fulfill that condition to maximize the amount of output power. If coupling between transmitter and receiver is stronger (e.g., a tightly coupled regime), optimum matching may utilize a loaded Q that is significantly smaller than the unloaded Q.

When using an array of such moving magnets, there may be mutual coupling between the magnets forming the array. This mutual coupling can cause internal forces and demagnetization. According to an embodiment, the array of magnets can be radially symmetrical, e.g., spheroids, either regular or prolate, as shown in FIGS. 10A and 10B. FIG. 10A shows the parallel field lines of the magnetic flux density in a magnetized sphere. FIG. 10B shows the corresponding magnetic field strength (H) in a magnetized sphere. From these figures that can be seen that there may be virtually zero displacement forces between magnets in a spheroid shaped three-dimensional array.

Therefore, the magnets are preferably in-line with the axis of the spheroid or the disc shown as 1000. This causes the internal forces to vanish for angular displacement of the magnets. This causes the resonance frequency to be solely defined by the mechanical system parameters. A sphere has these advantageous factors, but may also have a demagnetization factor is low as ⅓, where an optimum demagnetization factor is one. Assuming equal orientation of axes in all directions, a disc shaped array can also be used. A disc-shaped 3D array may also result in low displacement forces, if the disc radius is much larger than its thickness and if the magnets are appropriately oriented and suspended. Discs may have a higher magnetization factor, for example closer to 1.

Magnetization factor of a disc will depend on the width to diameter ratio. A disc-shaped array may be packaged into a form factor that is more suitable for integration into a device, since spheroids do not have a flat part that may be easily used without increasing the thickness of the host device.

The following is a comparison of magneto-mechanical systems with ferrimagnetic materials (ferrites). Ferrimagnetic materials or ferrites may be modeled as a magneto-mechanical system or conversely, magneto-mechanical systems may be considered as ferrites with special properties that may not be achievable with the classical ferrite materials. This will be shown in the following:

In ferrimagnetic substances, the magnetic moments of adjacent atoms are aligned opposite like in antiferromagnetic materials but the moments do not fully compensate so that there is a net magnetic moment. However, this is less than in ferromagnetic materials that can be used for permanent magnets.

Even though there are weaker magnetic effects, some of these ferrimagnetic materials, known as ferrites, have a low electrical conductivity. This makes these materials useful in the cores of AC inductors and transformers since induced eddy currents are lower.

A low electrical conductivity can also be found in a magneto-mechanical system composed of a multitude of small elementary magnets that are mutually electrically isolated so that eddy currents are attenuated.

The crystalline ferromagnetic and ferrimagnetic materials may be structured in magnetic domains also called Weiss domains. Atoms in a domain are aligned so that a net magnetic moment results. These domains may be considered as the magnets of a magneto-mechanical system.

In many magnetic materials, to a varying degree, the domain magnetization tends to align itself along one of the main crystal directions. This direction is called the easy direction of magnetization and represents a state of minimum energy. In a ferrite material, the directions of crystal domains may be considered randomly oriented so that there is complete cancellation and the resultant net magnetic moment at macroscopic level is zero, if no external magnetic field is applied. This is in contrast to the magneto-mechanical systems where the "elementary" magnets are equally oriented.

To rotate the magnetic moment of a crystalline domain in another (non-easy) direction, a certain force and work is required depending on the angle of rotation. Such work is performed if the ferrimagnetic material is subjected to an external magnetic field.

The force (e.g., mechanical or magnetic) of a magneto-mechanical system that sets the magnetic orientation of domains back to their state of minimum energy, if the external field is removed, may be considered as the torsion spring of a magneto-mechanical system. Since crystal domains in ferrites have different shapes and sizes, they appear as different spring constants. In a magneto-mechanical system, elementary oscillators may have an equal spring constant.

Stronger external fields cause more domains to be aligned or better aligned to the direction given by the external magnetic field. This effect is called magnetic polarization. This may be mathematically expressed as:

$$B=\mu_0 H+J=\mu_0(H+M)=\mu_0\mu_r H$$

where J is the magnetic polarization, M is the magnetization, and $\mu_r$ the relative permeability.

The magnetization effect may be considered as a magnification of the magnetic flux density at the receive location by the factor $\mu_r$ using rotatable magnetic moments. This principle of local magnification of magnetic flux density is inherent to the magneto-mechanical system described above. Thus a relative permeability may be attributed to a magneto-mechanical system. In a resonant system, this relative permeability will be a function of frequency and reaches a maximum close to the resonance frequency.

Another mechanism for changing the domain magnetization which may occur in ferrite materials is the direction of magnetization remains the same but the volumes occupied by the individual domains may change. In this process, called domain wall motion, the domains whose magnetization direction is closest to the field direction grow larger while those that are more unfavorably oriented shrink in size.

This kind of magnetization process differs from that of a magneto-mechanical system as described above. If the external magnetic field is continuously increased, the ferrite material will be progressively magnetized until a point of saturation is reached. Saturation is a state where net magnetic moments of domains are maximally aligned to the external magnetic field.

Magneto-mechanical systems, as described above, saturate when the angular displacement of elementary magnets reaches the maximum peak angular displacement. The dynamic behavior when an alternating external magnetic field is applied is different. For this purpose the magnetization process of a bulk ferrite material can be considered. Considering a typical magnetization curve (M as a function of the external field H) of a ferrite, three major regions can be identified in which the ferrite shows different dynamic behavior.

At low magnetization, domain wall movements and rotations are mainly reversible. Being reversible means that the original magnetization condition can be returned when the external field is increased and then again decreased to its original field strength, other than hysteresis effects.

The second region of the magnetization curve is one in which the slope of magnetization (M vs. H) is greater and in which irreversible domain wall motion occurs.

The third section of the curve is one of irreversible domain rotations. Here the slope is very flat indicating the high field strength that is required to rotate the remaining domain magnetization in line with the external magnetic field.

Irreversible domain wall motion or domain rotation explains the well-known hysteresis in the magnetization curve that is presented by all ferrites in a more or less pronounced manner. Hysteresis means that the magnetization or the induction B lags relative to the external magnetic field. As a consequence, the induction B at a given field H cannot be specified without knowledge of the previous magnetic history of the ferrite sample. Thus hysteresis may be considered as memory inherent to the material.

The area included in a hysteresis loop is a measure of the magnetic losses incurred in a cyclic magnetization process e.g. as resulting from an alternating external magnetic field.

With respect to the application of wireless energy transfer, there will be a requirement to drive a ferrite at least into the second region of magnetization where hysteresis losses typically become significant. This requirement is different e.g. for a communication receiver antenna. This is, however, not further shown here.

At higher frequencies two major loss contributors can be identified in ferrite materials:
hysteresis losses due to irreversible domain changes; and
eddy current losses due to residual conductivity in the ferrite. Hysteresis losses increase proportionally with frequency as the energy to cycle once around the hysteresis loop is independent of the speed. Eddy current losses have the effect of broadening the hysteresis loop.

Magneto-mechanical systems using a torsion spring as described above are largely hysteresis-free, where irreversible effects are concerned. At higher frequencies eddy current losses must be expected too. At lower frequencies (<<1 MHz) a magneto-mechanical system has the potential to provide high Q-factors at levels close to saturation.

For alternating fields, a ferrite core material may be characterized by its complex permeability:

$$\mu = \mu' + j\mu''$$

The real and imaginary parts represent the permeability with the magnetization in phase and in quadrature to the external field, respectively.

The two permeabilities can often be found plotted in data sheets for ferrite materials. Typically, the real component is fairly constant with frequency, rises slightly, then falls rapidly at higher frequencies. The imaginary component (representing the losses) on the other hand first rises slowly and then increases quite abruptly where the real component is falling sharply.

The maximum in $\mu'$ that occurs shortly before cut-off is ferrimagnetic resonance. Ferrimagnetic resonance is an intrinsic property of a ferrite material and may be considered as the upper frequency at which the material can be used. It is also observed that the higher the permeability $\mu'$ of the material, the lower the frequency of the ferrimagnetic resonance. This phenomenon of resonance indicates domain rotation, a counter torque (spring), and a certain inertial moment. It can be shown that the resonance frequency depends on the so-called gyromagnetic ratio.

Ferrites made for lower frequency applications show a certain resonance phenomenon similar to a magneto-mechanical system however with an extremely low Q-factor so that this effect cannot be technically exploited for a magnetically resonant wireless power system.

Gyromagnetic resonance with high Q-factors (up to 10,000) can be observed at microwave frequencies (>1 GHz) in certain ferrite materials (e.g. Yttrium Iron Garnets) if the material is subjected to strong static magnetic fields. This effect, which is based on electron spin precession, can be exploited to build microwave components such as circulators, isolators, high-Q filters and oscillators. Non-radiative energy transfer using coupled magnetic resonance in the microwave range would however be limited to extremely short range.

Gyromagnetic resonance may be considered as a magneto-mechanical system at the atomic level. A difference is however that magnetic moments are precessing around the field lines of the static magnetic field rather than oscillating axially. In both cases there is, however, a moving magnetic moment and an angular displacement.

Therefore, it can be seen at the magneto-mechanical systems can use ferrimagnetism and gyromagnetism as part of their energy transfer.

A magneto-mechanical system may be formed of a single permanent magnet or of a multitude (an array) of elementary magnets. Theoretical analyses shows that:
the ratio of magnetic moment-to-inertial moment increases with the number of elementary magnets. This ratio is similar to the gyromagnetic ratio known from ferromagnetism.
the performance of the magneto-mechanical system increases with this ratio. A figure of merit for the performance of a magneto-mechanical receiver can be expressed as:

$$k_c = \frac{P_{av}}{H_{AC}^2 V_s},$$

where $P_{av}$ denotes the power that is available under the condition of optimum matching, $H_{AC}$ is the external alternating magnetic field strength, and $V_s$ the volume required by the magneto-mechanical system. This figure of merit, which is called the specific power conversion factor, is indicative of how much power per unit system volume can be extracted from an alternating magnetic field, $H_{AC}'$ if penduli are perpendicularly oriented to the direction of the exciting magnetic field.

Theoretical analysis using the assumption of rod magnets of length $l_{em}$ shows that for a given system Q-factor and operating frequency, the specific power conversion factor increases inversely proportional to $l_{em}^2 l$; and thus to $Ne^{2/3}$ where Ne is the number of elementary oscillators fitting into the unit system volume. This equation does not hold for items in saturation, which means that the angular displacement of the torsion penduli is not limited by stoppers. This is a very interesting result indicating the advantage of an array of elementary magnets over a single oscillating magnet. Higher the specific power conversion factors can have lower field strengths where the system saturates.

As a consequence of saturation, at a given frequency there exists an upper bound for the available power per unit system volume, which depends on
the maximum peak angular displacement $\theta_{peak}$
the strength of the external alternating magnetic field $H_{AC}$.

Theory shows that this upper bound linearly increases with $H_{AC}'$. This upper bound is an important design parameter for a magneto-mechanical system. It also shows that there exists some degree of freedom to design magneto-mechanical systems as long as the ratio $$\frac{Q_{UL} \cdot H_{AC}}{l_{em}^2}$$

remains constant, where $Q_{UL}$ is the unloaded Q-factor of the magneto-mechanical system.

The above analysis shows that using an array of micro magneto-mechanical oscillators enables the design of a system with a performance that may be better than anything achievable in practice with a single macro oscillator. A macro sized oscillator would require an extremely high Q-factor that could not be realized in a mechanical system.

Another embodiment uses micro-electromechanical systems (MEMS) to create the magneto-mechanical systems. FIG. 11 schematically illustrates an example array of magnetic oscillators fabricated using MEMS technology in accordance with certain embodiments described herein. An array 1100 may be formed of a number of magnet elements such as 1102. Each magnet elements 1102 is formed of two U-shaped slots 1112, 1114 that are micro-machined or etched into a silicon substrate. A permanent rod magnet 1104, 1106 of similar size is formed within the slots. The magnet may be 10 μm or smaller. At the micrometer level, crystalline materials may behave differently than larger sizes. Hence, this system can provide considerable angular displacement e.g. as high as 10° or more and extremely high Q factors. Other configurations in accordance with certain embodiments described herein can instead utilize other structures (e.g., torsional springs), in other positions and/or in other orientations, which couple the magnetic oscillators to the surrounding material.

These devices may be formed in a single bulk material such as silicon. FIG. 11 shows an example structure in accordance with certain embodiments described herein. In an example configuration, the magnet elements 1102 shown in FIG. 11 can be fabricated in a two-dimensional structure in a common plane (e.g., a portion of a planar silicon wafer, shown in FIG. 11 in a top view, oriented parallel to the plane of the page) and such two-dimensional structures can be assembled together to form a three-dimensional structure. However, the example structure shown in FIG. 11 should not be interpreted as only being in a two-dimensional wafer structure. In other example configurations, different sub-sets of the magnet elements 1102 can be fabricated in separate structures that are assembled together to form a three-dimensional structure (e.g., the three top magnet elements 1102, shown in FIG. 11 in a side view, can be fabricated in a portion of one silicon wafer oriented perpendicularly to the plane of the page and the three bottom magnet elements 1102, shown in FIG. 11 in a side view, can be fabricated in a portion of another silicon wafer oriented perpendicularly to the plane of the page).

The magnets 1104, 1106 can have a high magnetization e.g. higher than 1 Tesla. In an exemplary embodiments, the magnet itself may be composed of two half pieces, one piece attached to the upper side and the other piece attached to the lower side. These devices can be mounted so that the center of gravity coincides with the rotational axes. The device may be covered with a low friction material, or may have a vacuum located in the area between the tongue and bulk material in order to reduce type the friction.

Figure 12:
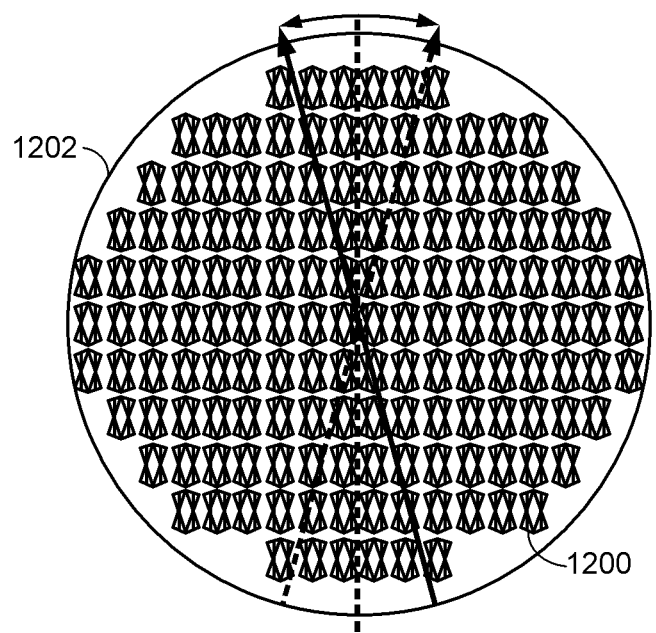
FIG. 12 schematically illustrates a cut through area of a three-dimensional array of magnetic oscillators in accordance with certain embodiments described herein.

FIG. 12 schematically illustrates a cut through area of a three-dimensional array of magnetic oscillators 1200 in accordance with certain embodiments described herein. While the example structure shown in FIG. 12 could be in a single two-dimensional wafer structure oriented parallel to the page, FIG. 12 should not be interpreted as only being in a two-dimensional wafer structure. For example, the three-dimensional array 1202 through which FIG. 12 shows a two-dimensional cut can comprise a plurality of planar wafer portions oriented perpendicularly to the page such that the cross-sectional view of FIG. 12 includes side views of magnetic oscillators 1200 from multiple such planar wafer portions. In one embodiment, the array 1202 itself is formed of a radial symmetric shape, such as disc shaped. The disc shaped array 1202 of FIG. 12 may provide a virtually constant demagnetization factor at virtually all displacement angles. In this embodiment, an induction coil may be wound around the disc to pick up the dynamic component of the oscillating induction field generated by the MEMS-magneto mechanical system. The resulting dynamic component of the system may be expressed as $$m_x(t) = |m| \cdot \sin \theta(t) \cdot e_x$$

Figure 13:
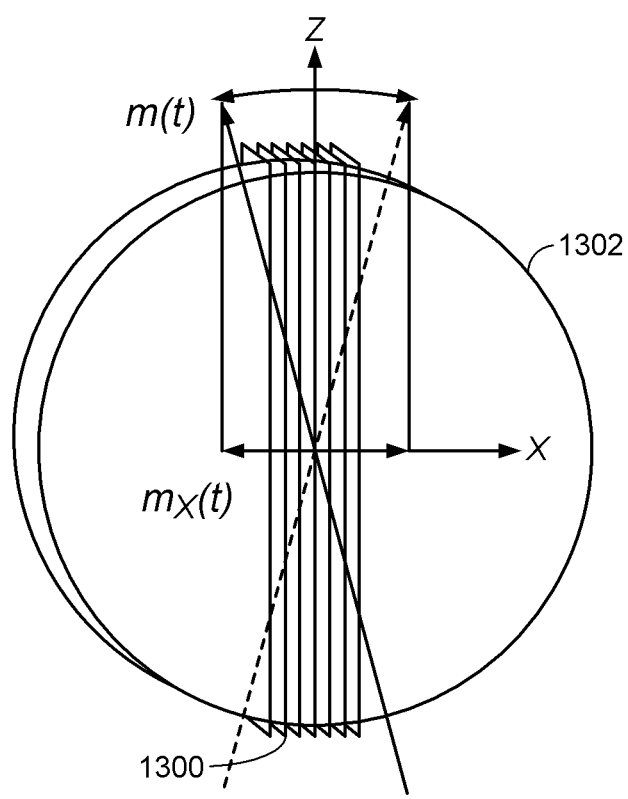
FIG. 13 schematically illustrates an example coupling coil wound around a disk having a plurality of magnetic oscillators in accordance with certain embodiments described herein.

FIG. 13 schematically illustrates an example induction coil 1300 wound around a disk 1302 having a plurality of magnetic oscillators in accordance with certain embodiments described herein.

Mathematical equations for the power that can be received by a magneto-mechanical system per unit system volume can be derived in terms of
system parameters such as geometry (e.g. size or number of elementary oscillators)
material properties
frequency
external alternating magnetic field strength.

Equations for the maximum available power are determined under the constraints of a limited angular displacement and Q-factor of the magneto-mechanical oscillator. These equations analyze the potential of magneto-mechanical systems and to find optimum design parameters. A primary system parameter is a parameter that is independent of any other parameter of the set and thus cannot be expressed as a function of another parameter.

To analyze the system, the following set of primary parameters have been chosen:

$V_s$: Volume of magneto mechanical system [m$^3$].
$l_{em}$: Length of elementary rod magnet [m]
$\rho_{em}$: Length-to-radius ratio of elementary magnet
$v_{em}$: Specific volume of elementary magnet in [m$^3$/kg]
$H_{em}$: Internal magnetic field strength of elementary magnet [A/m]
α: Fill factor (Ratio of total magnetic volume to system volume)
$Q_{UL}$: Unloaded Q-factor of mechanical resonator(s). It includes the losses due to mechanical friction, radiation, and due to conversion from mechanical to electrical energy.
$\theta_{peak}$: Maximum peak displacement angle of magnet rod supported by the mechanical resonator [rad].
$f_0$: Resonance frequency [Hz]
$H_{Ac}$: Externally applied alternating magnetic field [A/m]
$P_{av\_mech}$: Available mechanical power (maximum power into load)

Secondary system parameters and physical quantities include:

$r_{em}$: Radius of elementary rod magnet [m] (=$l_{em}/\rho_{em}$)
$V_{em}$: Volume of an elementary magnet=$l_{em}^3 \pi/\rho_{em}$
$V_e$: Volume required by an elementary system (resonator) (=$V_{em}/\alpha$)
$N_e$: Number of elementary magnets in system volume=$V_s/V_e$
I: Moment of inertia of elementary magnet [kg m$^2$]. It is a function of $v_{em}$, $l_{em}$, and $\rho_{em}$
$K_r$: Torsion spring constant [kg m$^2$s$^{-2}$]. It is a function of $Q_{UL}$, $f_0$, and I
$\Gamma_s$: Dynamic rotational friction (angular velocity proportional to torque) representing all system losses [kg m$^2$ s$^{-1}$]. It is a function of $Q_{UL}$, $f_0$, and I and includes the losses due to mechanical friction, radiation, and due to conversion from mechanical to electrical energy.
$\sigma_L$: Load equivalent dynamic rotational friction [kg m$^2$ s$^{-1}$]
$\bar{\omega}$: Angular velocity of oscillating elementary system
m: magnetic moment (vector) [Am$^2$]. It is a function of $l_{em}$, $\rho_{em}$, and $H_{em}$
θ: Displacement angle [rad]
φ: Angle between magnetic moment vector at zero displacement and vector of externally applied alternating magnetic field [rad]

There is an analogy between linear electrical systems composed of inductances, capacitance, and resistances; and a rotational mechanical system formed of a torsion spring, inertial moment, and dynamic friction (angular velocity proportional to torque). This analogy is shown in Table 1:

| Electrical system | | Rotational mechanical system |
|---|---|---|
| Physical quantities: | | |
| I (current) | ⇔ | T (torque) |
| U (voltage) | ⇔ | $\varpi$ (angular velocity) |
| Component parameters: | | |
| L | ⇔ | $\dfrac{1}{K_r}$ |
| C | ⇔ | I |
| $R_p$ | ⇔ | $\dfrac{1}{\Gamma}$ |
| Resonance frequency: | | |
| $f_0 = \dfrac{1}{2\pi\sqrt{LC}}$ | ⇔ | $f_0 = \dfrac{1}{2\pi}\sqrt{\dfrac{K_r}{I}}$ |
| Unloaded Q (parallel circuit): | | |
| $Q_{UL} = R_p\sqrt{\dfrac{C}{L}}$ | ⇔ | $Q_{UL} = \dfrac{1}{\Gamma}\sqrt{K_r I}$ |

Derivations of equations are shown below. From the resonance condition the torsion spring constant:

$$K_r = (2\pi f_0)^2 I$$

It is assumed that the optimum matching condition $$\Gamma_L = \Gamma_s$$

can be achieved with the magneto-electrical transducer (induction coil+load). From Q-factor equation (see Table 1), the dynamic frictions become:

$$\Gamma_s = \Gamma_L = \frac{\sqrt{K_r I}}{Q_{UL}} = \frac{2\pi f_0 I}{Q_{UL}}$$

Using above defined parameters, the magnetic moment of an elementary magnet may be expressed as:

$$m = V_{em} \cdot H_{em}$$

and the moment of inertia:

$$I = \frac{V_{em} \cdot l_{em}^2}{12 \upsilon_{em}}$$

Based on the well-known equation above, the RMS value of the driving torque becomes:

$$T = m \cdot \mu_0 H_{AC} \cdot \sin(\varphi)$$

Applying Kirchhoff's node law provides the following relation between the torques in the circuit.

$$T - T_{K_r} - T_I - T_{\Gamma_s} - T_{\Gamma_L} = 0$$

At resonance frequency, we get by definition:

$$T_{K_r} = -T_I$$

hence $$T = T_{\Gamma_s} + T_{\Gamma_L}$$

and from matching condition:

$$T_{\Gamma_L} = \frac{T}{2}$$

The available mechanical power per elementary system may now be simply expressed as:

$$T_{\Gamma_L} = \frac{T}{2}$$

Using the above equations, the following relation on the total power available from the entire magneto mechanical system can be obtained:

$$P_{av\_mech} = \frac{3}{2\pi} \cdot \frac{\mu_0^2 H_{em}^2 Q_{UL} \upsilon_{em} V_s \alpha}{f_0 l_{em}^2} \cdot (H_{AC} \cdot \sin(\varphi))^2$$

This equation indicates that for given $Q_{UL}$ and frequency, the available power increases inversely proportionally to the length of an elementary rod magnet, disregarding the resulting angular displacement. For the peak angular displacement of an elementary oscillator we get:

$$\theta_{peak} = \frac{3\sqrt{2}}{2\pi^2} \cdot \frac{\mu_0 H_{em} Q_{UL} \upsilon_{em}}{f_0^2 l_{em}^2} \cdot H_{AC} \cdot \sin(\varphi)$$

indicating that the peak angular displacement at given Q-factor and frequency increases inversely proportional to the length of an elementary rod magnet. Thus setting some constraints on the external magnetic field strength $H_{AC}$ and therefore also on the power that can be extracted from the external magnetic field. Introducing a maximum angular displacement constraint leads to a relation for the frequency-magnet length product:

$$f_0 \cdot l_{em} = \left( \frac{3\sqrt{2}}{2\pi^2} \cdot \frac{\mu_0 H_{em} Q_{UL} \upsilon_{em}}{\theta_{peak}} \cdot H_{AC} \cdot \sin(\varphi) \right)^{\frac{1}{2}}$$

Using the constraint on the peak angular displacement (saturation), an interesting equation on the maximum available power can be obtained:

$$P_{av\_mech} = \frac{\pi}{\sqrt{2}} \cdot \mu_0 H_{em} V_s \alpha f_0 \theta_{peak} \cdot H_{AC} \cdot \sin(\varphi)$$

This equation may also be expressed in terms of the total magnetic moment $m_{tot}$ of the magneto-mechanical system and the external magnetic induction BAC as follows:

$$P_{av\_mech} = \frac{1}{2}(2\pi f_0) \cdot |m_{tot} \times B_{AC}| \cdot \frac{\theta_{peak}}{\sqrt{2}}$$

This equation is not anymore dependent on Q-factor, length of rod magnet, which indicates a certain degree of freedom in the design of magneto-mechanical systems. These parameters however are hidden or implicit to the peak angular displacement $\theta_{peak}$. The maximum available power linearly increases with frequency. This behavior can also be found in systems that directly based on Faraday's Induction law.

A useful definition to quantify performance of a magneto-mechanical system is the specific power conversion factor that has already been described.

$$k_c = \frac{P_{av\_mech}}{H_{AC}^2 V_s} = \frac{3}{2\pi} \cdot \frac{\mu_0^2 H_{em}^2 Q_{UL} v_{em} \alpha}{f_0 l_{em}^2} \cdot \sin\varphi$$

as well as the saturation field strength:

$$H_{AC\_sat} = \theta_{peak} \left( \frac{3\sqrt{2}}{2\pi^2} \cdot \frac{\mu_0 H_{em} Q_{UL} v_{em}}{f_0^2 l_{em}^2} \cdot \sin(\varphi) \right)^{-1}$$

A system may be designed for a high $k_c$, compromising with a lower saturation level. Conversely, a system may be designed for a higher saturation level compromising with a lower $k_c$.

Numerical Example

For a numerical example, the following parameters are assumed:
$V_s = 4 \cdot 10^{-6}$ m$^3$ (=4 cm$^3$ equivalent to a disk with a diameter of 4 cm and thickness of 3.1 mm)
$v_{em} = 131.6 \cdot 10^{-6}$ m$^3$/kg
$H_{em} = 1$T/$\mu_0$ A/m
$\alpha = 0.25$
$Q_{UL} = 1000$
$\theta_{peak} = 0.175$ rad (=10°)
$\phi = 0$ The frequency of major interest is f=135 kHz.
The field strength of major interest is $H_{AC} = 5$ A/m
The power theoretically linearly increases with frequency. It must be noticed however that at higher frequencies power may be additionally limited by other factors such as maximum stored oscillatory energy in the system, mechanical strain, etc. These other factors are not considered in the following estimate.

The available power as a function of the external alternating magnetic field strength can be computed for different length of the elementary magnets. A system using rod magnets of 20 μm length saturates at approximately 2.5 W while a system using 10 μm rod length saturates at a lower value of about 600 mW. The 10 μm system however is more sensitive (higher specific power conversion factor) than the one that uses 20 um rods. This can be checked at a field strength of 5 A/m.

Based on this example, one can see that a disc shaped system with 4 cm diameter 3 cm thickness can extract up to 260 mW from a magnetic field of 5 amps per meter at 135 kHz.

The above description discloses various features of a power receiver in which a plurality of magnetic oscillators and a pick-up coil are used. In view of the following description, many of these same concepts and structures of the power receiver (e.g., the plurality of magnetic oscillators) can be used in a power transmitter as well, in accordance with certain embodiments described herein. In addition, while the description below discloses various features of a power transmitter, many of these same concepts and structures of the power transmitter (e.g., the three-dimensional array with at least two planes of magnetic oscillators and the time-invariant components of the summed magnetic moments of the at least two planes having substantially equal magnitudes and pointing in substantially opposite directions) can be used in a power receiver as well, in accordance with certain embodiments described herein. Furthermore, a power transfer system comprising at least one power transmitter and at least one power receiver can have one or both of the at least one power transmitter and the at least one power receiver having a structure as described herein.

Figure 14:
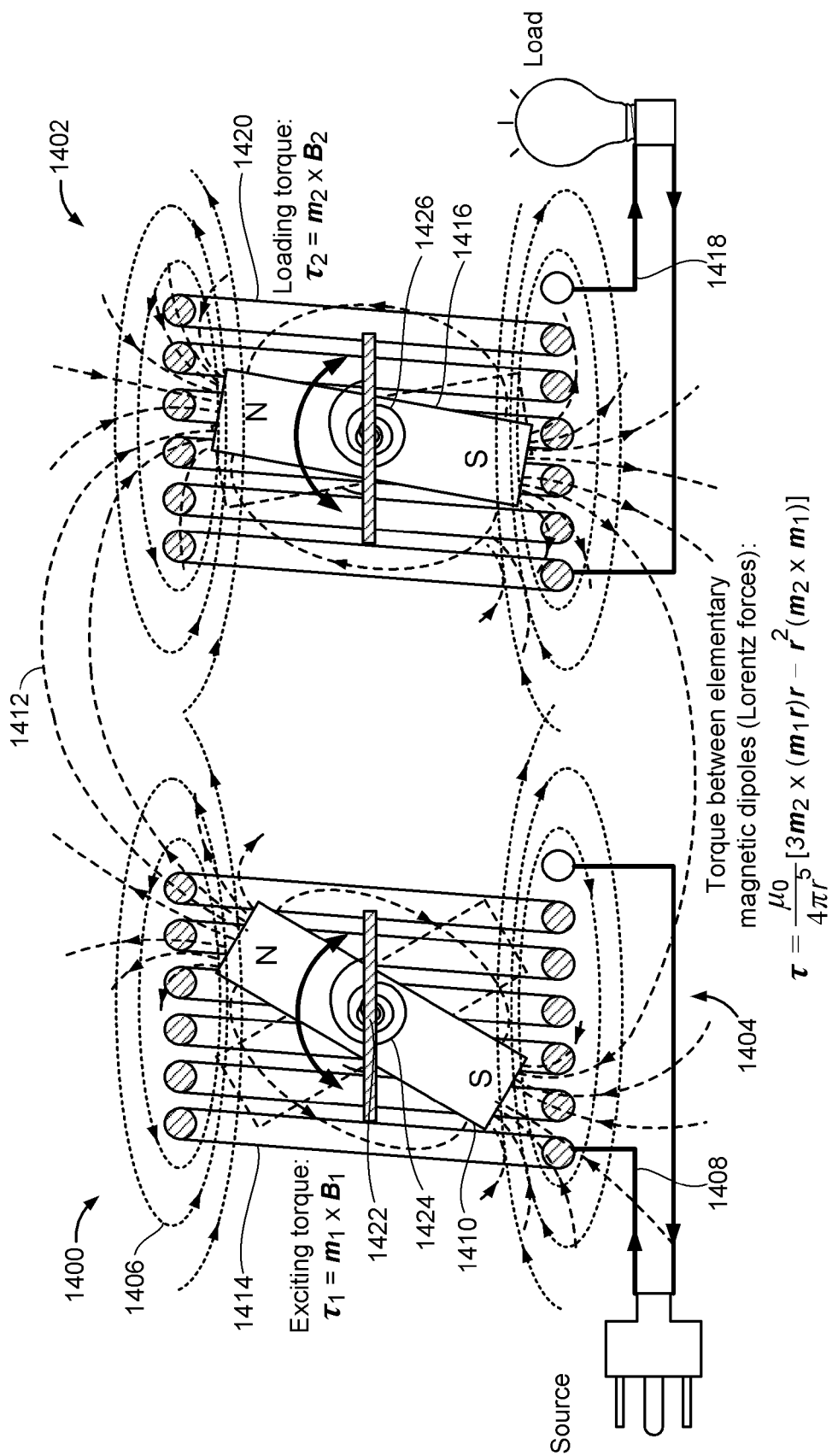
FIG. 14 schematically illustrates an example power transmitter configured to wirelessly transfer power to at least one power receiver, in accordance with certain embodiments described herein.

FIG. 14 schematically illustrates an example power transmitter 1400 configured to wirelessly transfer power to at least one power receiver 1402, in accordance with certain embodiments described herein. The power transmitter 1400 comprises at least one excitation circuit 1404 configured to generate a time-varying (e.g., alternating) first magnetic field 1406 in response to a time-varying (e.g., alternating) electric current 1408 flowing through the at least one excitation circuit 1404. The time-varying first magnetic field 1406 has an excitation frequency. The power transmitter 1400 further comprises a plurality of magnetic oscillators 1410 (e.g., that are mechanically coupled to at least one substrate, which is not shown in FIG. 14). FIG. 14 schematically illustrates one example magnetic oscillator 1410 compatible with certain embodiments described herein for simplicity, rather than showing the plurality of magnetic oscillators 1410. Each magnetic oscillator 1410 of the plurality of magnetic oscillators has a mechanical resonant frequency substantially equal to the excitation frequency. The plurality of magnetic oscillators 1410 is configured to generate a time-varying (e.g., alternating) second magnetic field 1412 in response to the first magnetic field 1406.

As schematically illustrated by FIG. 14, the at least one excitation circuit 1404 comprises at least one coil 1414 surrounding (e.g., encircling) at least a portion of the plurality of magnetic oscillators 1410. The at least one coil 1414 has a time-varying (e.g., alternating) current 1408 $I_f(t)$ flowing through the at least one coil 1414, and generates a time-varying (e.g., alternating) first magnetic field 1406 which applies a torque (labeled as "exciting torque" in FIG. 14) to the magnetic oscillators 1410. In response, the magnetic oscillators 1410 rotate about an axis. In this way, the at least one excitation circuit 1404 and the plurality of magnetic oscillators 1410 convert electrical energy into mechanical energy. The magnetic oscillators 1410 generate a second magnetic field 1412 which wirelessly transmits power to the power receiver 1402 (e.g., a power receiver as described above). For example, the power receiver 1402 can comprise a receiving plurality of magnetic oscillators 1416 configured to rotate in response to a torque applied by the second magnetic field 1412 and to induce a current 1418 in a pick-up coil 1420, thereby converting mechanical energy into electrical energy.

As schematically illustrated by FIG. 13 for a pick-up coil for a power transmitter utilizing a plurality of magnetic oscillators, the at least one coil 1414 of the power transmitter 1400 can comprise a single common coil that is wound around at least a portion of the plurality of magnetic oscillators 1410 of the power transmitter 1400. The wires of the at least one coil 1414 can be oriented substantially perpendicular to the "dynamic" component (described in more detail below) of the magnetic moment of the plurality of magnetic oscillators 1410 to advantageously improve (e.g., maximize) coupling between the at least one coil 1414 and the plurality of magnetic oscillators 1410. As described more fully below, the excitation current flowing through the at least one coil 1414 can be significantly lower than those used in conventional resonant induction systems. Thus, certain embodiments described herein advantageously do not have special requirements for the design of the at least one coil 1414.

As described above with regard to FIG. 11 for the magnetic oscillators of a power receiver, the magnetic oscillators 1410 of the power transmitter 1400 in accordance with certain embodiments described herein can be MEMS structures fabricated on at least one substrate (e.g., a semiconductor substrate, a silicon wafer) using lithographic processes such as are known from MEMS fabrication techniques. Each magnetic oscillator 1410 of the plurality of magnetic oscillators 1410 can comprise a movable magnetic element configured to rotate about an axis 1422 in response to a torque applied to the movable magnetic element by the first magnetic field 1406. The movable magnetic element can comprise at least one spring 1424 (e.g., torsion spring, compression spring, extension spring) mechanically coupled to the substrate and configured to apply a restoring force to the movable magnetic element upon rotation of the movable magnetic element. The magnetic oscillators 1416 of the power receiver 1402 can comprise a movable magnetic element (e.g., magnetic dipole) comprising at least one spring 1426 (e.g., torsion spring, compression spring, extension spring) mechanically coupled to a substrate of the power receiver 1402 and configured to apply a restoring force to the movable magnetic element upon rotation of the movable magnetic element.

For example, the plurality of magnetic oscillators 1410 can comprise a plurality of planes, each of which comprises a silicon substrate and a corresponding set of magnetic oscillators 1410. As schematically illustrated in FIG. 11, "U"-shaped slots can be formed into the silicon substrate using an appropriate etching process, thereby forming elongate portions (e.g., tongues) that are suspended by beams of material (e.g., material remaining between the two "U"-shaped slots of the magnetic oscillator). These beams can serve as low-friction springs (e.g., torsion springs) for the magnetic oscillator. A magnetic layer can be applied to the elongate portions of the magnetic oscillator. A three-dimensional array of magnetic oscillators can be fabricated by adding multiple such planes together, and a high magnet packing density can be achieved for desired performance of the power transmitter.

Figure 15:
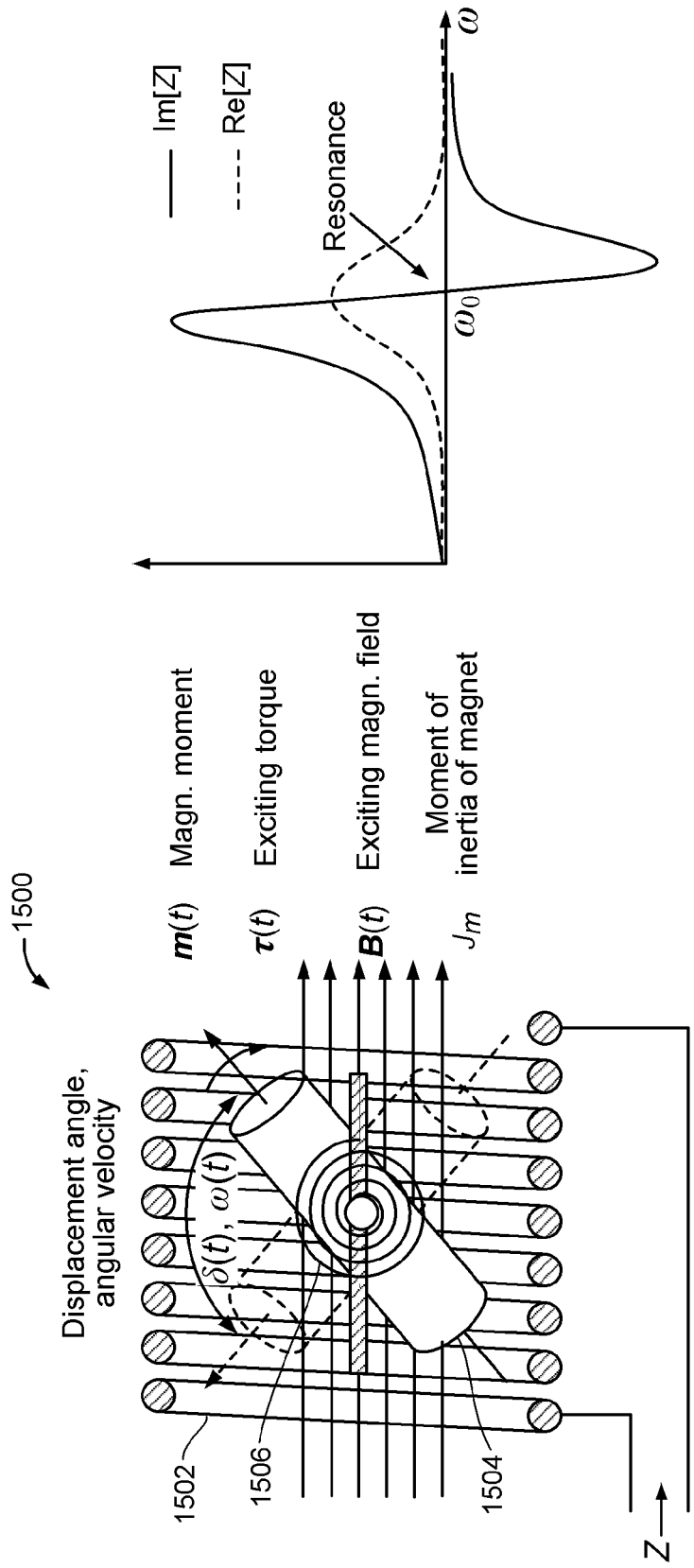
FIG. 15 schematically illustrates an example power transmitter in accordance with certain embodiments described herein and a plot of input impedance versus frequency showing a resonance phenomenon.

FIG. 15 schematically illustrates an example power transmitter 1500 in accordance with certain embodiments described herein in which the at least one excitation circuit 1502 is driven at a frequency substantially equal to a mechanical resonant frequency of the magnetic oscillators 1504. The at least one excitation circuit 1502 generates the first magnetic field which applies the exciting torque to the magnetic oscillator 1504, which has a magnetic moment and a moment of inertia. The direction of the magnetic moment is time-varying, but its magnitude is constant. The resonant frequency of a magnetic oscillator 1504 is determined by the mechanical properties of the magnetic oscillator 1504, including its moment of inertia (a function of its size and dimensions) and spring constants. For micro-electro-mechanical system (MEMS) magnetic oscillators 1504, the resonant frequency can be in the MHz range; for macroscopic magnetic oscillators 1504, the resonant frequency can be in the hundreds of Hz range.

The input impedance of the at least one excitation circuit 1502 has a real component and an imaginary component, both of which vary as a function of frequency. Near the resonant frequency of the magnetic oscillators 1504, the real component is at a maximum, and the imaginary component disappears (e.g., is substantially equal to zero) (e.g., the current and voltage of the at least one excitation circuit 1502 are in phase with one another). At this frequency, the impedance, as seen at the terminals of the at least one coil, appears as purely resistive, even though a strong alternating magnetic field may be generated by the magnetic oscillators. The combination of the at least one excitation circuit 1502 and the plurality of magnetic oscillators 1504 can appear as an "inductance-less inductor" which advantageously avoids (e.g., eliminates) the need for resonance-tuning capacitors as are used in conventional power transmitters.

Since the time-varying (e.g., alternating) second magnetic field is generated by the plurality of magnetic oscillators 1504, there are no high currents flowing through the electrical conductors of the at least one excitation circuit 1502 at resonance, such as exist in conventional resonant induction systems. Therefore, losses in the at least one excitation circuit 1502 (e.g., the exciter coil) can be negligible. In certain such configurations, thin wire or standard wire can be used in the at least one excitation circuit 1502, rather than Litz wire. The main losses occur in the plurality of magnetic oscillators 1504 and its surrounding due to mechanical friction, air resistance, eddy currents, and radiation in general. As is the case with other MEMS systems, the magnetic oscillators 1504 can have Q-factors which largely exceed those of electrical resonators, particularly in the kHz and MHz ranges of frequencies. For example, the Q-factor of the plurality of magnetic oscillators 1504 can be greater than 10,000. Such high Q-factors may be more difficult to achieve in other resonant induction systems using capacitively loaded wire loops in some cases.

The large Q-factor of certain embodiments described herein can also be provided by the plurality of magnetic oscillators 1504. The power that can be wirelessly transmitted to a load is the product of the root-mean-square (RMS) values of the torque $\tau_{RMS}$ applied to the magnetic oscillator 1504 and the frequency (e.g., angular velocity) $\omega_{RMS}$. To allow for sufficient oscillation (e.g., sufficient angular displacement of the magnetic oscillator 1504) when power transfer distances increase, the torque $\tau_{RMS}$ (e.g., the dampening torque applied to the magnetic oscillator 1504 of a power transmitter 1500, or the loading torque applied to the magnetic oscillator of a power receiver) can be reduced, but such increased distances result in lower power. This power loss can be compensated for by increasing the frequency $\omega_{RMS}$, within the limits given by the moment of inertia of the magnetic oscillators 1504 and the torsion springs 1506. The performance of the magnetic oscillator 1504 can be expressed as a function of the gyromagnetic ratio $\gamma=m/J_m$ (where m is the magnetic moment of the magnetic oscillator 1504, and $J_m$ is the moment of inertia of the magnetic oscillator 1504), and this ratio can advantageously be configured to be sufficiently high to produce sufficient performance at higher frequencies.

A plurality of small, individually oscillating magnetic oscillators arranged in a regular three-dimensional array can advantageously be used, instead of a single permanent magnet. The plurality of magnetic oscillators can have a larger gyromagnetic ratio than a single permanent magnet having the same total volume and mass as the plurality of magnetic oscillators. The gyromagnetic ratio of a three-dimensional array of N magnetic oscillators with a sum magnetic moment m and a sum mass $M_m$ can be expressed as:

$$\gamma(N) = \frac{12 \cdot N \cdot \frac{m}{N}}{\frac{NM_m}{N}\left(\frac{l_m}{\sqrt[3]{N}}\right)^2} = \frac{12m}{M_m l_m^2}\sqrt[3]{N}^2$$

where $l_m$ denotes the length of an equivalent single magnet (N=1). This equation shows that the gyromagnetic ratio increases to the power of ⅔ with decreasing size of the magnetic oscillators. In other words, a large magnetic moment produced by an array of small magnetic oscillators can be accelerated and set into oscillation by a faint torque (e.g., the exciting torque produced by a small excitation current flowing through the at least one excitation current of a power transmitter or the loading torque in a power receiver produced by a distant power transmitter). The performance of the plurality of magnetic oscillators can be increased by increasing the number of magnetic oscillators since the magnetic moment increases more than does the moment of inertia by increasing the number of magnetic oscillators. Using an array of magnetic oscillators (e.g., with features size in the micron range), resonant frequencies far in the MHz range can be used.

Figure 16:
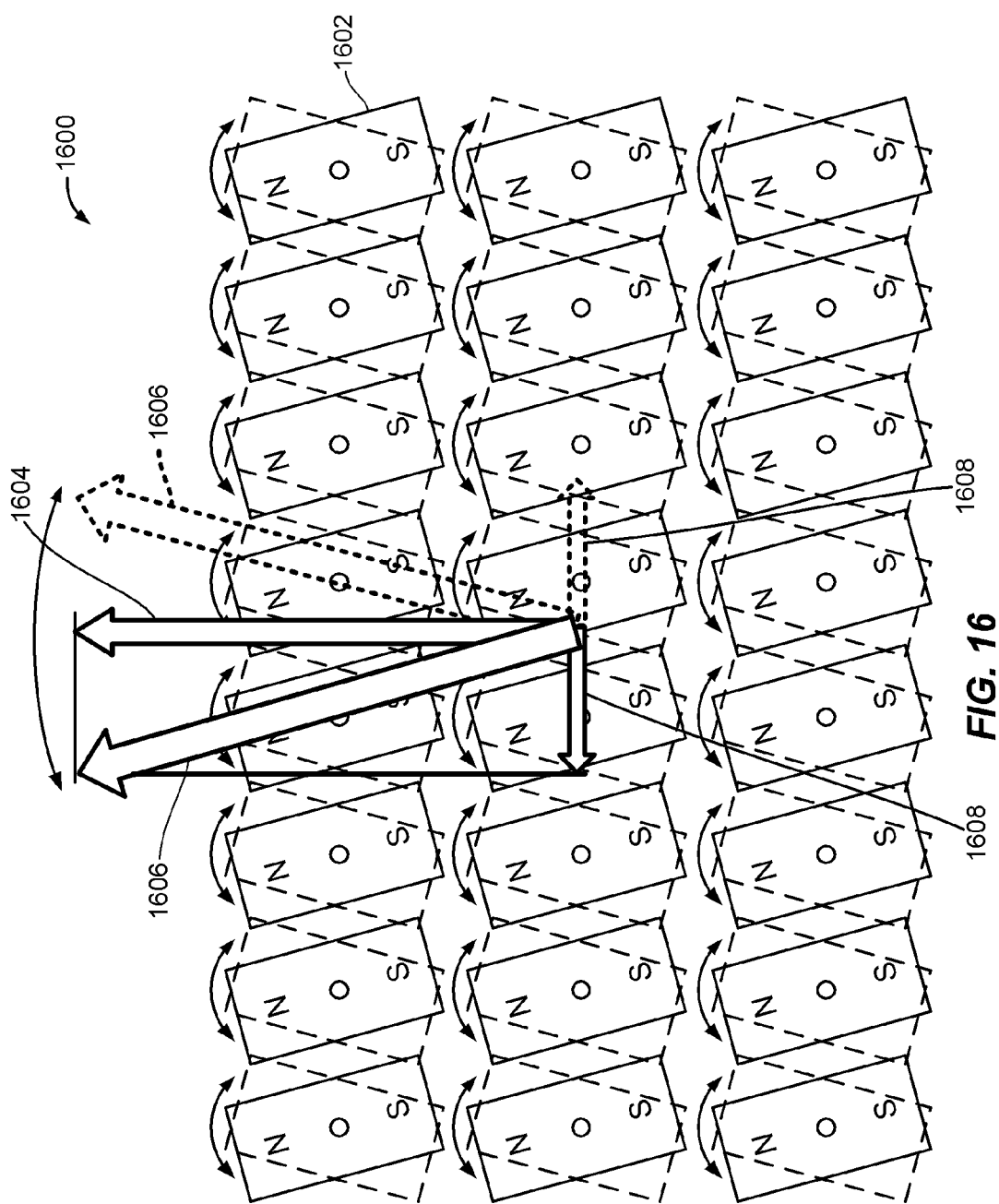
FIG. 16 schematically illustrates an example portion of a configuration of a plurality of magnetic oscillators in accordance with certain embodiments described herein.

FIG. 16 schematically illustrates an example portion 1600 of a configuration of a plurality of magnetic oscillators 1602 in accordance with certain embodiments described herein. The portion 1600 shown in FIG. 16 comprises a set of magnetic oscillators 1602 of the plurality of magnetic oscillators 1602. This arrangement of magnetic oscillators 1602 in a regular structure is similar to that of a plane in an atomic lattice structure (e.g., a three-dimensional crystal).

The oscillation of the magnetic oscillators 1602 between the solid positions and the dashed positions produces a sum magnetic moment that can be decomposed into a "quasi-static" component 1604 (denoted in FIG. 16 by the vertical solid arrow) and a "dynamic" component 1606 (denoted in FIG. 16 by the solid and dashed arrows at an angle to the vertical, and having a horizontal component 1608 shown by solid and dashed arrows). The dynamic component 1606 is responsible for energy transfer. For an example configuration such as shown in FIG. 16, for a maximum angular displacement of 30 degrees, a volume utilization factor of 20% for the set of magnetic oscillators 1602, a rare-earth metal magnetic material having 1.6 Tesla at its surface, a "dynamic" flux density in the order of 160 mTesla peak can be achieved virtually without hysteresis losses, thereby outperforming conventional ferrite technology.

However, the quasi-static component 1604 can be of no value in the energy transfer. In fact, in practical applications, it can be desirable to avoid (e.g., lessen or eliminate) the quasi-static component 1604, since it results in a strong magnetization (e.g., such as that of a strong permanent magnet) that can attract any magnetic materials in the vicinity of the structure towards the plurality of magnetic oscillators 1602.

The sum magnetic field generated by the plurality of magnetic oscillators 1602 can cause the individual magnetic oscillators 1602 to experience a torque such that they rest at a non-zero displacement angle. These forces may also change the effective torsion spring constant, thus modifying the resonant frequency. These forces can be controlled (e.g., avoided, reduced, or eliminated) by selecting the macro- scopic shape of the array of the plurality of magnetic oscillators 1602 to be rotationally symmetric (e.g., a disk-shaped array). For example, using an array that is radially symmetrical (e.g., spheroidal, either regular or prolate, as shown in FIGS. 10A, 10B, and 12) can produce effectively zero displacement between the magnetic oscillators 1602 in a spheroid-shaped three-dimensional array. The field lines of some magnetic field components inside a magnetized disk are parallel for any orientation of the magnetic moment, and in a disk-shaped array, resonant frequencies can be determined mainly by the moment of inertia and the torsional spring constant of the magnetic oscillators.

Figure 17:
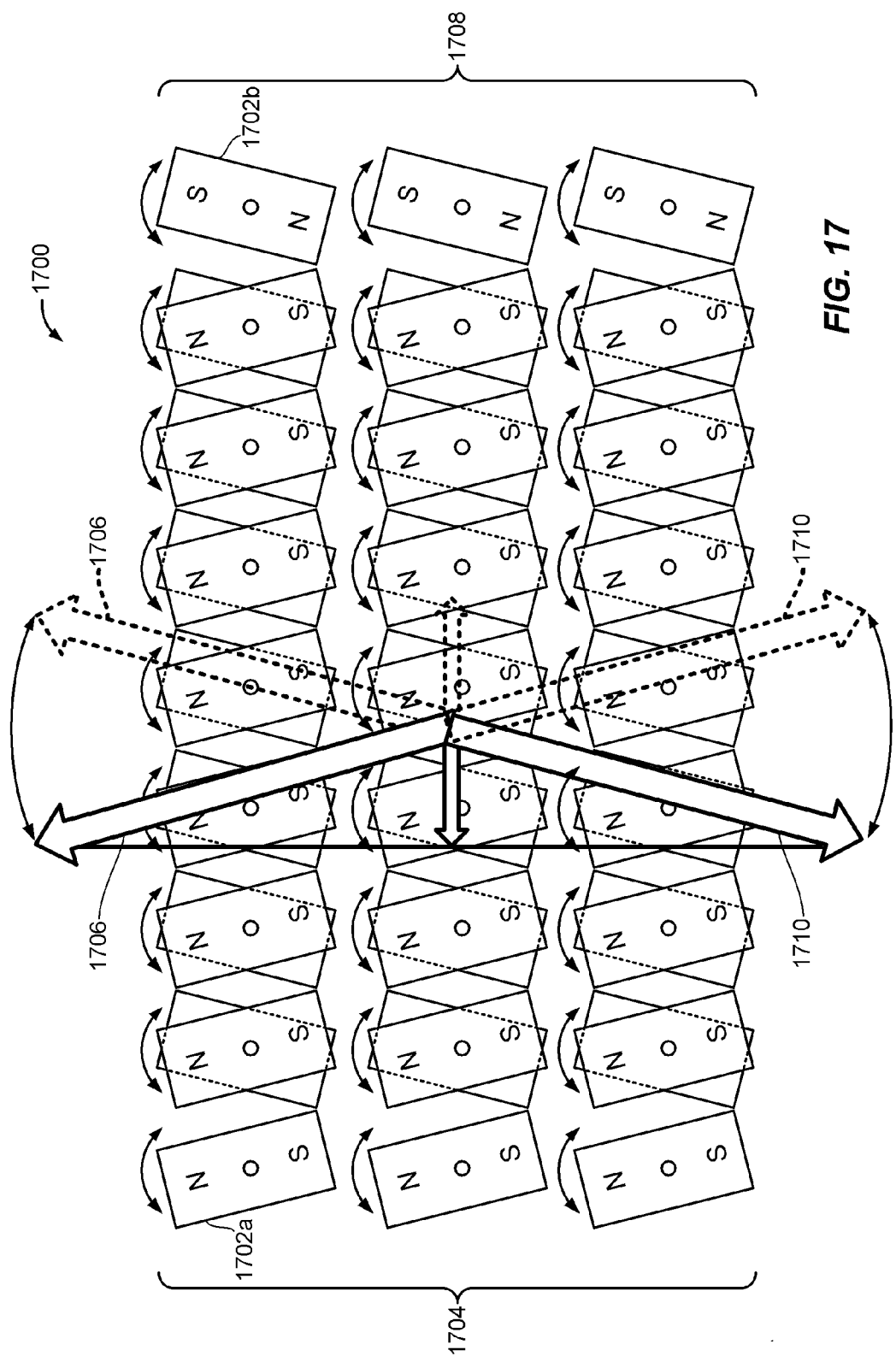
FIG. 17 schematically illustrates an example configuration in which the plurality of magnetic oscillators is arranged in which magnets are pairwise oriented in opposite directions so that the static component of the sum magnetic moment cancels out in accordance with certain embodiments described herein.

FIG. 17 schematically illustrates an example configuration in which the plurality of magnetic oscillators 1702 is arranged in a three-dimensional array 1700 in which the quasi-static components of various portions of the plurality of magnetic oscillators 1702 cancel one another, in accordance with certain embodiments described herein. The three-dimensional array 1700 of FIG. 17 comprises at least one first plane 1704 (e.g., a first layer) comprising a first set of magnetic oscillators 1702a of the plurality of magnetic oscillators 1702, with each magnetic oscillator 1702a of the first set of magnetic oscillators 1702a having a magnetic moment pointing in a first direction. The first set of magnetic oscillators 1702a has a first summed magnetic moment 1706 (denoted in FIG. 17 by the top solid and dashed arrows) comprising a time-varying component and a time-invariant component. The three-dimensional array 1700 further comprises at least one second plane 1708 (e.g., a second layer) comprising a second set of magnetic oscillators 1702b of the plurality of magnetic oscillators 1702. Each magnetic oscillator 1702b of the second set of magnetic oscillators 1702b has a magnetic moment pointing in a second direction. The second set of magnetic oscillators 1702b has a second summed magnetic moment 1710 (denoted in FIG. 17 by the bottom solid and dashed arrows) comprising a time-varying component and a time-invariant component. The time-invariant component of the first summed magnetic moment 1706 and the time-invariant component of the second summed magnetic moment 1710 have substantially equal magnitudes as one another and point in substantially opposite directions as one another. In this way, the quasi-static components of the magnetic moments of the first set of magnetic oscillators 1702a and the second set of magnetic oscillators 1702b cancel one another out (e.g., by having the polarities of the magnetic oscillators alternate between adjacent planes of a three-dimensional array 1700). In contrast, the time-varying components of the first summed magnetic moment 1706 and the second summed magnetic moment 1710 have substantially equal magnitudes as one another and point in substantially the same direction as one another.

The structure of FIG. 17 is analogous to the structure of paramagnetic materials that have magnetic properties (e.g., a relative permeability greater than one) but that cannot be magnetized (e.g., soft ferrites). Such an array configuration can be advantageous, but can produce a counter-torque acting against the torque produced by an external magnetic field on the magnetic oscillators. This counter-torque will be generally added to the torque of the torsion spring. This counter-torque may be used as a restoring force to supplement that of the torsion spring or to be used in the absence of a torsion spring in the magnetic oscillator. In addition, the counter-torque may reduce the degrees of freedom in configuring the plurality of magnetic oscillators.

Figure 18:
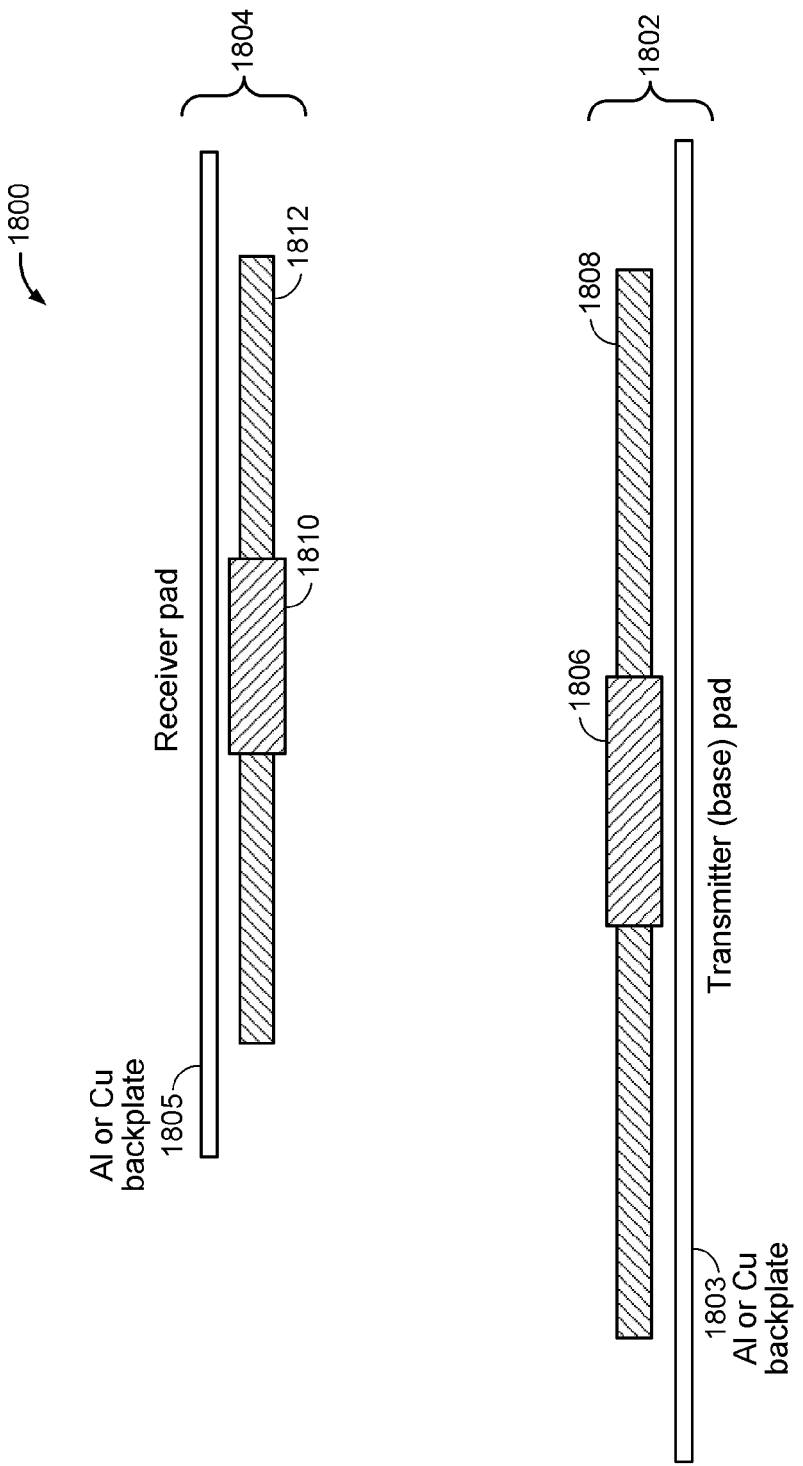
FIG. 18 schematically illustrates an example configuration of a power transmitter and a power receiver in accordance with certain embodiments described herein.

FIG. 18 schematically illustrates an example configuration 1800 of a power transmitter 1802 (e.g., a transmitter base pad coupled to an aluminum or copper back plate 1803)

and a power receiver 1804 (e.g., a receiver pad coupled to an aluminum or copper back plate 1805) in accordance with certain embodiments described herein. For planar low-profile designs for a power transfer pad, the power transmitter 1802 and/or the power receiver 1804 described herein can be used in which at least one coil and at least one disk comprising a plurality of magnetic oscillators is used. For example, the power transmitter 1802 can comprise at least one coil 1806 and at least one disk 1808 comprising a plurality of magnetic oscillators as described herein, and the power receiver 1804 can comprise at least one coil 1810 and at least one disk 1812 comprising a plurality of magnetic oscillators as described herein. Certain such configurations can lead to solutions that are analogous to a planar "solenoid" coil that uses a flat ferrite core (e.g., analogous to the at least one coil described herein) and a conductive back plate to shape the magnetic field. In certain such configurations, the system generates a substantially horizontal magnetic moment and can be characterized by a relatively strong coupling, even in misalignment conditions. As opposed to the "solenoid" configurations, certain embodiments described herein have the potential for higher Q-factors and do not require tuning capacitors (e.g., by using a core that is self-resonant). Losses in certain embodiments described herein can reduce to eddy current losses, but virtually no hysteresis losses and copper losses.

Figure 19:
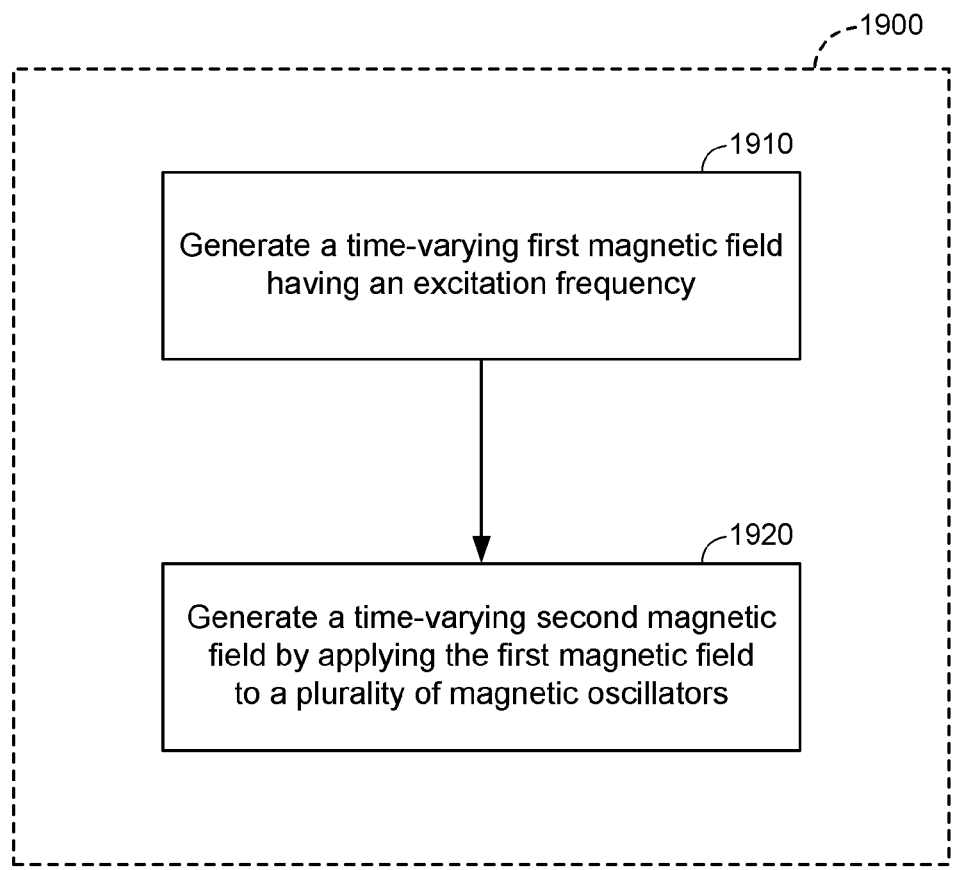
FIG. 19 is a flow diagram of an example method in accordance with certain embodiments described herein.

FIG. 19 is a flow diagram of an example method 1900 of transmitting power wirelessly in accordance with certain embodiments described herein. In an operational block 1910, the method 1900 comprises generating a time-varying first magnetic field having an excitation frequency. In an operational block 1920, the method 1900 further comprises generating a time-varying second magnetic field by applying the first magnetic field to a plurality of magnetic oscillators. Each magnetic oscillator of the plurality of magnetic oscillators has a mechanical resonant frequency substantially equal to the excitation frequency.

In certain embodiments, the wirelessly transmitted power is used for wirelessly charging an electronic device (e.g., wirelessly charging a mobile electronic device). In certain embodiments, the wirelessly transmitted power is used for wirelessly charging an energy-storage device (e.g., a battery) configured to power an electric device (e.g., an electric vehicle).

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations. For example, the power transmitter can comprise means for generating a time-varying first magnetic field having an excitation frequency, and means for generating a time-varying second magnetic field in response to the time-varying first magnetic field. The means for generating the time-varying first magnetic field can comprise at least one excitation circuit configured to have a time-varying electric current flowing through the at least one excitation circuit. The means for generating the time-varying second magnetic field can comprise a plurality of magnetic oscillators in which each magnetic oscillator of the plurality of magnetic oscillators has a mechanical resonant frequency substantially equal to the excitation frequency.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the embodiments of the invention.

The various illustrative blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the processor such that the processor can read information from, and write information to, the storage medium. In the alternative, the storage medium may be integral to the processor. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer readable media. The processor and the storage medium may reside in an ASIC. The ASIC may reside in a user terminal. In the alternative, the processor and the storage medium may reside as discrete components in a user terminal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

Various modifications of the above described embodiments will be readily apparent, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A power transmitter configured to wirelessly transfer power to at least one power receiver, the power transmitter comprising:
    at least one excitation circuit configured to generate a time-varying first magnetic field in response to a time-varying electric current flowing through the at least one excitation circuit, the time-varying first magnetic field having an excitation frequency; and
    a plurality of magnetic oscillators, each magnetic oscillator of the plurality of magnetic oscillators having a mechanical resonant frequency substantially equal to the excitation frequency, the plurality of magnetic oscillators configured to generate a time-varying second magnetic field in response to the first magnetic field.

2. The power transmitter of claim 1, wherein the at least one excitation circuit comprises at least one coil surrounding at least a portion of the plurality of magnetic oscillators.

3. The power transmitter of claim 1, wherein an impedance of the at least one excitation circuit has an imaginary component that is equal to zero at a frequency substantially equal to the mechanical resonant frequency.

4. The power transmitter of claim 1, further comprising at least one substrate mechanically coupled to the plurality of magnetic oscillators.

5. The power transmitter of claim 1, wherein the plurality of magnetic oscillators is a micro-electro-mechanical system (MEMS) structure.

6. The power transmitter of claim 1, wherein each magnetic oscillator of the plurality of magnetic oscillators comprises a movable magnetic element configured to rotate about an axis in response to a torque applied to the movable magnetic element by the first magnetic field.

7. The power transmitter of claim 6, wherein the movable magnetic element comprises at least one spring configured to apply a restoring force to the movable magnetic element upon rotation of the movable magnetic element.

8. The power transmitter of claim 1, wherein the plurality of magnetic oscillators is arranged in a three-dimensional array.

9. The power transmitter of claim 8, wherein the three-dimensional array comprises:
    at least one first plane comprising a first set of magnetic oscillators of the plurality of magnetic oscillators, each magnetic oscillator of the first set of magnetic oscillators having a magnetic moment pointing in a first direction, the first set of magnetic oscillators having a first summed magnetic moment comprising a time-varying component and a time-invariant component; and
    at least one second plane comprising a second set of magnetic oscillators of the plurality of magnetic oscillators, each magnetic oscillator of the second set of magnetic oscillators having a magnetic moment pointing in a second direction, the second set of magnetic oscillators having a second summed magnetic moment comprising a time-varying component and a time-invariant component, wherein the time-invariant component of the first summed magnetic moment and the time-invariant component of the second summed magnetic moment have substantially equal magnitudes and point in substantially opposite directions.

10. The power transmitter of claim 8, wherein the three-dimensional array comprises:
    a first plane comprising a first set of magnetic oscillators of the plurality of magnetic oscillators arranged to have a first polarity; and
    a second plane adjacent to the first plane, the second plane comprising a second set of magnetic oscillators of the plurality of magnetic oscillators arranged to have a second polarity different than the first polarity to at least partially reduce a quasi-static portion of a summed magnetic moment generated by the first set of magnetic oscillators and the second set of magnetic oscillators.

11. A method of transmitting power wirelessly, the method comprising:
    generating a time-varying first magnetic field having an excitation frequency; and
    generating a time-varying second magnetic field by applying the first magnetic field to a plurality of magnetic oscillators, each magnetic oscillator of the plurality of magnetic oscillators having a mechanical resonant frequency substantially equal to the excitation frequency.

12. The method of claim 11, wherein generating the time-varying first magnetic field comprises flowing an electrical current through at least one excitation circuit comprising at least one coil surrounding at least a portion of the plurality of magnetic oscillators.

13. The method of claim 12, wherein an impedance of the at least one excitation circuit has an imaginary component that is equal to zero at a frequency substantially equal to the mechanical resonant frequency.

14. The method of claim 11, wherein the plurality of magnetic oscillators is a micro-electro-mechanical system (MEMS) structure.

15. The method of claim 11, wherein generating the time-varying second magnetic field comprises rotating a movable magnetic element of each magnetic oscillator of the plurality of magnetic oscillators about an axis in response to a torque applied to the movable magnetic element by the first magnetic field.

16. The method of claim 15, further comprising applying a restoring force to the movable magnetic element upon rotation of the movable magnetic element.

17. The method of claim 11, wherein the plurality of magnetic oscillators is arranged in a three-dimensional array.

18. The method of claim 17, wherein the three-dimensional array comprises:
    at least one first plane comprising a first set of magnetic oscillators of the plurality of magnetic oscillators, each magnetic oscillator of the first set of magnetic oscillators having a magnetic moment pointing in a first direction, the first set of magnetic oscillators having a first summed magnetic moment comprising a time-varying component and a time-invariant component; and
    at least one second plane comprising a second set of magnetic oscillators of the plurality of magnetic oscillators, each magnetic oscillator of the second set of magnetic oscillators having a magnetic moment pointing in a second direction, the second set of magnetic oscillators having a second summed magnetic moment comprising a time-varying component and a time-invariant component, wherein the time-invariant component of the first summed magnetic moment and the time-invariant component of the second summed magnetic moment have substantially equal magnitudes and point in substantially opposite directions.

19. A power transmitter configured to wirelessly transfer power to at least one power receiver, the power transmitter comprising:
   means for generating a time-varying first magnetic field having an excitation frequency; and
   means for generating a time-varying second magnetic field in response to the time-varying first magnetic field.

20. The power transmitter of claim 19, wherein the means for generating the time-varying first magnetic field comprises at least one excitation circuit configured to have a time-varying electric current flowing through the at least one excitation circuit.

21. The power transmitter of claim 19, wherein the means for generating the time-varying second magnetic field comprises a plurality of magnetic oscillators, each magnetic oscillator of the plurality of magnetic oscillators having a mechanical resonant frequency substantially equal to the excitation frequency.

* * * * *